US008847665B2

(12) United States Patent
Araki et al.

(10) Patent No.: US 8,847,665 B2
(45) Date of Patent: Sep. 30, 2014

(54) SEMICONDUCTOR DEVICE AND METHOD OF CONTROLLING ANALOG SWITCH

(75) Inventors: Ryota Araki, Yokohama (JP); Tohru Mizutani, Santa Clara, CA (US)

(73) Assignee: Fujitsu Semiconductor Limited, Yokohama (JP)

( * ) Notice: Subject to any disclaimer, the term of this patent is extended or adjusted under 35 U.S.C. 154(b) by 17 days.

(21) Appl. No.: 13/596,829

(22) Filed: Aug. 28, 2012

(65) Prior Publication Data

US 2013/0088287 A1   Apr. 11, 2013

(30) Foreign Application Priority Data

Oct. 11, 2011  (JP) .................................. 2011-223575

(51) Int. Cl.
*H03K 17/06* (2006.01)
*H03K 17/0812* (2006.01)
(52) U.S. Cl.
CPC .. *H03K 17/08122* (2013.01); *H03K 2217/0018* (2013.01); *H03K 2217/0054* (2013.01)
USPC .......................................... 327/427; 327/391
(58) Field of Classification Search
None
See application file for complete search history.

(56) References Cited

U.S. PATENT DOCUMENTS

| 5,994,744 | A | 11/1999 | Katayama et al. |
| 6,194,952 | B1 * | 2/2001 | Shigehara ..................... 327/534 |
| 6,828,846 | B2 * | 12/2004 | Tsukazaki et al. ............ 327/404 |
| 7,492,207 | B2 * | 2/2009 | Cornelissens et al. ........ 327/365 |
| 7,514,983 | B2 * | 4/2009 | Miske ............................ 327/534 |
| 7,728,649 | B1 * | 6/2010 | Webb et al. ................... 327/534 |
| 7,746,152 | B2 * | 6/2010 | Nakatani et al. .............. 327/389 |
| 7,834,677 | B2 * | 11/2010 | Yu .................................. 327/391 |
| 7,924,083 | B2 * | 4/2011 | Chou et al. .................... 327/391 |
| 8,354,873 | B2 * | 1/2013 | Ono ............................... 327/391 |
| 8,368,453 | B2 * | 2/2013 | Company Bosch et al. .. 327/427 |
| 2003/0227311 | A1 * | 12/2003 | Ranganathan ................ 327/210 |
| 2006/0208787 | A1 * | 9/2006 | Callahan ....................... 327/404 |
| 2007/0194832 | A1 * | 8/2007 | Miske et al. .................. 327/427 |
| 2009/0058496 | A1 * | 3/2009 | Kapoor ......................... 327/391 |
| 2012/0242397 | A1 * | 9/2012 | Stultz et al. ................... 327/434 |

FOREIGN PATENT DOCUMENTS

JP     09-252241 A    9/1997
JP     10-041798 A    2/1998

* cited by examiner

*Primary Examiner* — Tuan T Lam
(74) *Attorney, Agent, or Firm* — Arent Fox LLP

(57) ABSTRACT

A semiconductor device has an analog switch, in which a P channel transistor and an N channel transistor are connected in parallel between an input terminal and an output terminal; a variable voltage circuit, which variably generates, according to an input voltage applied to the input terminal, potentials of a first gate voltage and first back gate voltage of the P channel transistor and of a second gate voltage and second back gate voltage of the N channel transistor; and a control circuit, which supplies to the variable voltage circuit a control signal controlling the analog switch to be conducting or non-conducting. In response to the control signal causing the analog switch to be conducting, the variable voltage circuit outputs the variable-generated first gate voltage and second gate voltage to the respective gates of the P channel transistor and N channel transistor.

7 Claims, 22 Drawing Sheets

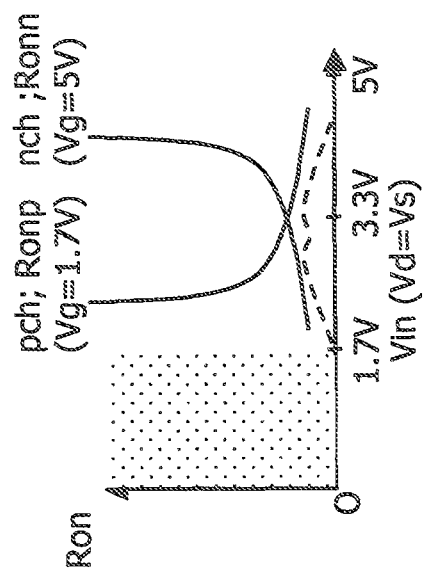
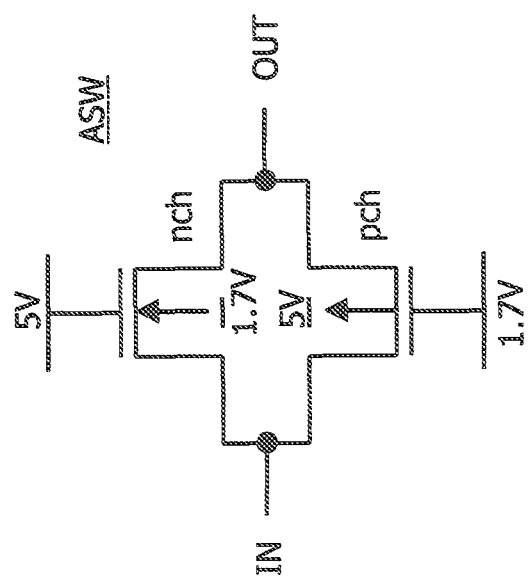
FIG. 6

SEMICONDUCTOR DEVICE AND METHOD OF CONTROLLING ANALOG SWITCH

CROSS-REFERENCE TO RELATED APPLICATION

This application is based upon and claims the benefit of priority of the prior Japanese Patent Application No. 2011-223575, filed on Oct. 11, 2011, the entire contents of which are incorporated herein by reference.

FIELD

The embodiment relates to a semiconductor device having a CMOS analog switch and a method of controlling the analog switch.

BACKGROUND

A CMOS analog switch has an N channel MOS transistor and a P channel MOS transistor connected in parallel; opposite-phase control signals are input to the gates of each of the transistors, and the conducting state (on) and non-conducting state (off) of the NMOS transistor and the PMOS transistor are switched by the control signals. No matter what the potentials of the input voltage and output voltage between ground and the power supply voltage, the conducting state and non-conducting state are maintained.

In general, an NMOS transistor is in a conducting state when the gate-source voltage exceeds a positive threshold voltage VthN, but at less than the threshold voltage VthN is in a non-conducting state. Hence when the power supply voltage VDD is applied to the gate, the NMOS transistor is in the conducting state when the source is at a voltage between 0 and (VDD−VthN), but is in the non-conducting state when the source is at a voltage between (VDD−VthN) and VDD. Conversely, a PMOS transistor is in a conducting state when the gate-source voltage exceeds a negative threshold voltage VthP (when the gate is lower by VthP than the source), but is in the non-conducting state when the gate-source voltage is less than the threshold voltage VthP. Hence on applying the ground voltage VSS to the gate, when the source is at a voltage between VthP and VDD, the device is in the conducting state, but when the source is at a voltage between 0 and VthP, the device is in the non-conducting state.

Hence if an NMOS transistor and a PMOS transistor are connected in parallel, and if the power supply voltage VDD is applied to the NMOS transistor gate and the ground voltage VSS is applied to the PMOS transistor gate, a conducting state is maintained at any voltage between 0 and VDD at the sources and drains of the two transistors.

Further, a back gate voltage is applied to the substrate region below the gate electrode, and in general the back gate voltage Vbg is 0 V in the case of an NMOS transistor and is the power supply voltage VDD in the case of a PMOS transistor.

Such a CMOS analog switch is described in Japanese Patent Application Laid-open No. H9-252241 and Japanese Patent Application Laid-open No. H10-41798.

However, the withstand voltage of the gate insulating film (hereafter called the "gate withstand voltage") provided between the gate electrode and the substrate in a MOS transistor is comparatively low. If on the other hand the range 0 V to VDD of voltages applied at the input and output terminals of a CMOS analog switch is large, there are cases in which the voltage difference between the gate voltage Vg and the back gate voltage Vbg may exceed the gate withstand voltage. In such cases, the MOS transistor fails.

For this reason, it is necessary to hold the back gate voltage Vbg at a prescribed voltage and ensure that the voltage difference between the gate voltage Vg and the back gate voltage Vbg does not exceed the gate withstand voltage.

However, if the back gate voltage is made a voltage other than the ground voltage VSS or the power supply voltage VDD, the substrate region is forward-biased relative to the source/drain region connected to the input/output terminals of the CMOS analog switch, a leakage current occurs, and the input terminal voltage is no longer transmitted to the output terminal.

SUMMARY

According to the first aspect of the embodiment is a semiconductor device, having:
an analog switch, in which a P channel transistor and an N channel transistor are connected in parallel between an input terminal and an output terminal;
a variable voltage circuit, which variably generates, according to an input voltage applied to the input terminal, potentials of a first gate voltage and first back gate voltage of the P channel transistor and of a second gate voltage and second back gate voltage of the N channel transistor; and
a control circuit, which supplies to the variable voltage circuit a control signal controlling the analog switch to be conducting or non-conducting, wherein in response to the control signal causing the analog switch to be conducting, the variable voltage circuit outputs the variable-generated first gate voltage and second gate voltage to the respective gates of the P channel transistor and N channel transistor.

By means of the first aspect, a semiconductor device which forms an appropriately a conducting state for input voltages over a broad voltage range is provided.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a figure representing various examples of gate voltages and back gate voltages of CMOS analog switches.

DESCRIPTION OF EMBODIMENTS

Figure 1:
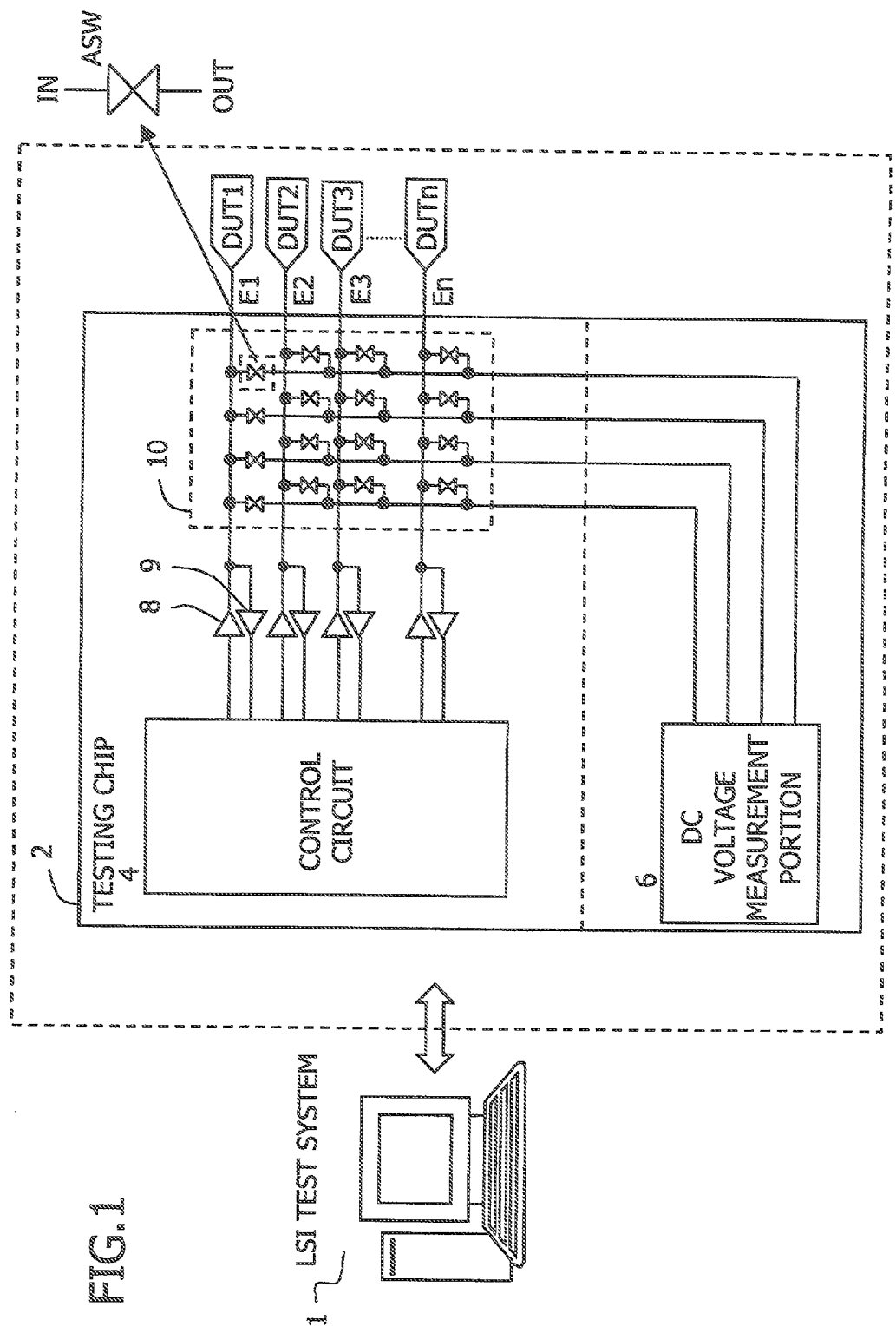
FIG. 1 is a figure representing the configuration of a testing chip.

FIG. 1 is a figure representing the configuration of a testing chip. An LSI test system 1 is connected to a testing chip 2 which operates as an interface, and external terminals of devices for testing DUT1 to DUTn are connected to the input/output terminals E1 to En of the testing chip 2.

The testing chip 2 has a control circuit 4 which controls tests; the control circuit 4 is connected to the input/output terminals E1 to En via drivers 8 which drive output signals to the input/output terminals E1 to En, and comparators 9 which take input signals as input and detect H and L levels. The testing chip 2 has a DC voltage measurement portion 6, which is connected to an arbitrary combination of input/output terminals E1 to En via analog switches ASW in a pin matrix 10. The analog switches ASW are supplied with control signals, not shown, from the control circuit 4, and the arbitrary combination of analog switches ASW are put into the conducting state. By this means, the arbitrary combination of input terminals are connected to the DC voltage measurement portion 6.

The LSI test system 1 outputs prescribed signals to the devices for testing DUT1 to DUTn via the testing chip 2, and takes as input the signals output in response. The LSI test system 1 measures the DC voltages of output signals output by the devices for testing using the DC voltage measurement portion 6 within the testing chip 2. This DC voltage measurement portion 6 may be provided within the testing chip 2 as represented in FIG. 1, or may be provided in a chip separate from the testing chip 2.

As described below, the analog switches ASW each connect the source and drain terminals respectively of a P channel transistor (hereafter "PMOS transistor") and an N channel transistor (hereafter "NMOS transistor") between the input/output terminals IN and OUT, and opposite-phase control signals, not shown, are input to the respective transistor gates to control the devices in the conducting state and non-conducting state. In general, the power supply voltage, which is the maximum voltage of the input signal, is applied to the back gate of a PMOS transistor, and the ground voltage, which is the minimum voltage of the input signal, is applied to the back gate of an NMOS transistor. When, by means of the control signals, ground voltage is applied to the gate of the PMOS transistor and the power supply voltage is applied to the gate of the NMOS transistor, the analog switch ASW is put into the conducting state. And when by means of the control signals the power supply voltage is applied to the gate of the PMOS transistor and ground voltage is applied to the gate of the NMOS transistor, the analog switch ASW is put into the non-conducting state.

In recent years, MOS transistors have been developed with source-drain withstand voltages equal to or greater than power supply voltages. By using such MOS transistors as the CMOS transistors in the analog switches ASW, analog switching performs switching for input signals having a DC voltage equal to or greater than the power supply voltage in the testing chip 2. In the example of FIG. 1, even when the DC voltages of the output signals of the devices for testing DUT are equal to or greater than the power supply voltage in the testing chip 2, the analog switches ASW is turned on and off.

However, the gate withstand voltage, which is the withstand voltage of the gate insulating film of a MOS transistor, tends to be lower as the transistor is miniaturized. However, the voltage difference between the gate voltage and the back gate voltage is demanded to be kept at or below the gate withstand voltage. Hence when the gate voltage and back gate voltage of a PMOS transistor and NMOS transistor are ground voltage and the power supply voltage, as in an analog switch of the prior art, the analog switch does not switch for an input signal having a voltage higher than the power supply voltage cannot be switched. This problem is explained below in detail.

Figure 2:
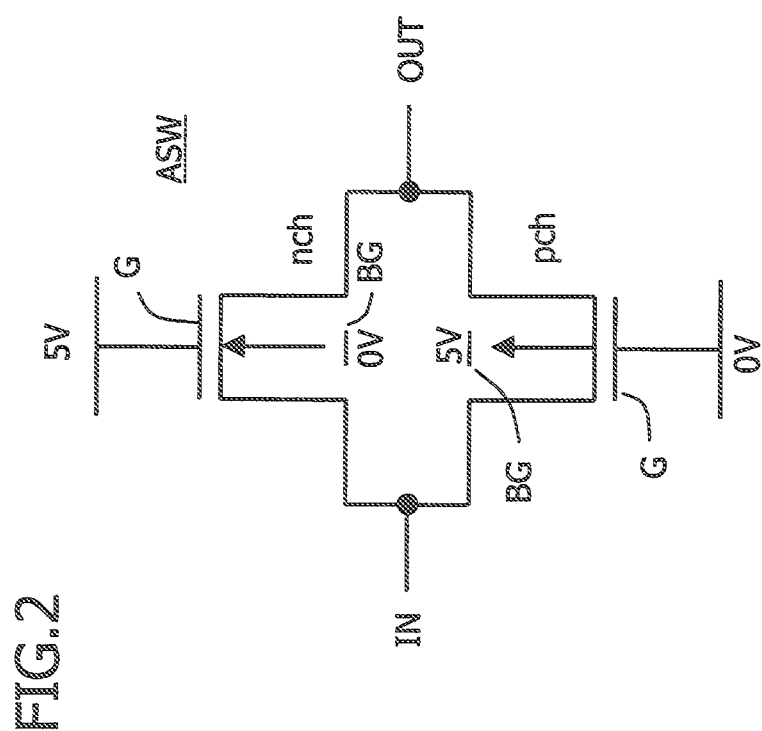
FIG. 2 is a circuit diagram of a CMOS analog switch.

FIG. 2 is a circuit diagram of a CMOS analog switch. FIG. 3, FIG. 4, FIG. 5 and FIG. 6 represent various examples of gate voltages and back gate voltages of CMOS analog switches. As premises it is assumed that for both the NMOS and PMOS transistors the gate withstand voltage Vr is 3.3 V, and that the input voltage Vin has a minimum voltage Vmin of ground voltage (0 V) and a maximum voltage Vmax of 5 V. The threshold voltages are respectively Vth(P) and Vth(N).

Vr=3.3 V
Vmin=0 V
Vmax=5 V

The CMOS analog switch ASW of FIG. 2 has a PMOS transistor pch and an NMOS transistor nch connected in parallel between an input terminal IN and an output terminal OUT. Control signals of opposite phase are applied to the gates of the two transistors. In a method generally used, in order to make the analog switch conducting, the minimum voltage Vmin=0 V of the input voltage Vin is applied to the gate G of the PMOS transistor pch, the maximum voltage Vmax=5 V of the input voltage Vin is applied to the back gate BG thereof, the maximum voltage Vmax=5 V is applied to the gate G of the NMOS transistor nch, and the minimum voltage Vmin=0 V is applied to the back gate BG thereof, as represented in FIG. 2. In this state, no matter what the input voltage Vin within the range from 0 V to 5 V, at least one among the PMOS transistor pch and the NMOS transistor nch is in the conducting state. Specifically, with the analog switch in the conducting state, both the input terminal IN and the output terminal OUT are at the input voltage Vin, and thus if the input voltage Vin is from Vth(P) to 5 V, the PMOS transistor is conducting, and if the input voltage Vin is from 0 V to (5 V−Vth(N)), the NMOS transistor is conducting.

However, as the above premise the gate withstand voltages Vr of the PMOS and NMOS transistors are 3.3 V, so that as explained above, if a voltage across the gate G and back gate BG is 5 V, such voltage is greater than the gate withstand voltage of Vr, and destroy of transistor gate insulating film occurs.

Figure 3:
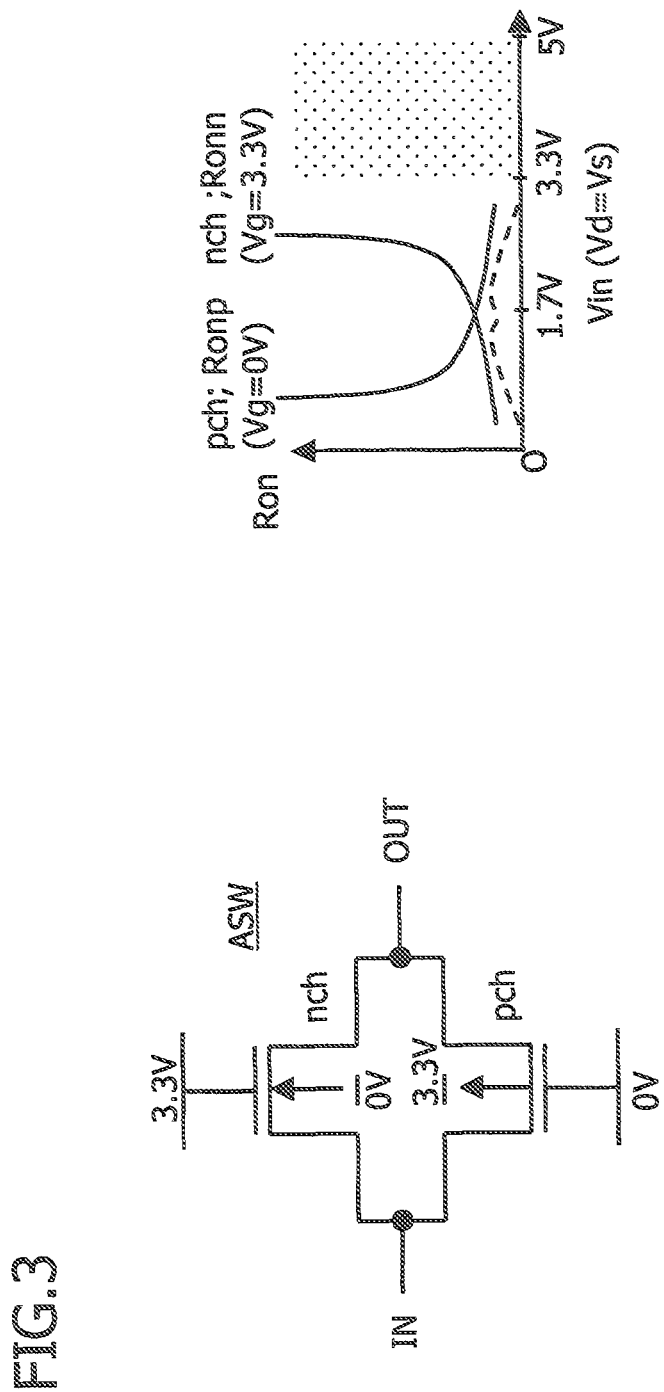
FIG. 3 is a figure representing various examples of gate voltages and back gate voltages of CMOS analog switches.

FIG. 3 is a figure representing the relation between a CMOS analog switch and the turn-on resistance Ron for the input voltage Vin. As represented in FIG. 3, it is assumed that the back gate BG of the PMOS transistor is driven to 3.3 V which is the gate withstand voltage Vr, and that the gate G of the NMOS transistor is driven to 3.3 V which is the gate withstand voltage Vr. As represented in the graph of the input voltage Vin and turn-on resistance Ron in FIG. 3, in this case for an input voltage Vin of Vth(P) to 3.3 V the PMOS transistor pch conducts, but the more the input voltage Vin approaches the Vth(P), the higher is the turn-on resistance Ron. On the other hand, for an input voltage Vin of 0 V to (3.3 V−Vth(N)), the NMOS transistor nch conducts, but the more the input voltage approaches 3.3 V−Vth(N), the higher is the turn-on resistance Ron. Hence the combined turn-on resistance Ron for the two transistors is lower over the range of input voltages Vin from 0 V to 3.3 V, as indicated by the dashed line.

However, if the input voltage Vin exceeds 3.3 V, the PN junctions between the P type drain and source regions and the N type back gate region of the PMOS transistor are put into a forward-biased state, and a forward-direction leakage current flows from the drain and source regions to the back gate region. As a result, the analog switch does not transmit the 3.3 V to 5 V voltage of the input voltage Vin to the output terminal OUT.

Figure 4:
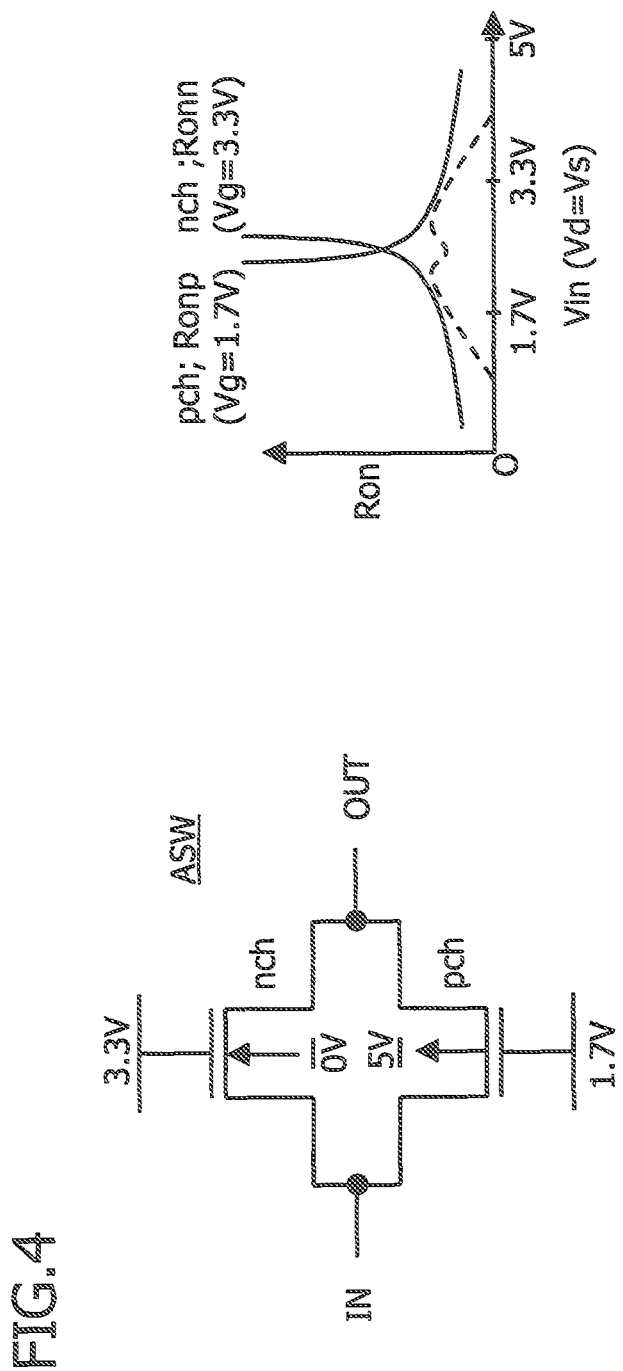
FIG. 4 is a figure representing various examples of gate voltages and back gate voltages of CMOS analog switches.

FIG. 4 is an example in which for the PMOS transistor pch the gate voltage is set to 1.7 V (=5V−3.3 V) and the back gate voltage is set to 5 V, and for the NMOS transistor nch the gate voltage is set to 3.3 V and the back gate voltage is set to 0 V. In this case, the voltages across the gate and back gate are held at the gate withstand voltage of Vr=3.3 V for both transistors, so that destroy of gate insulating film does not occur. In this example, the PMOS transistor pch is conducting for an input voltage Vin of (1.7V+Vth(P)) to 5 V, and the NMOS transistor nch is conducting for an input voltage Vin of 0 V to (3.3 V−Vth(N)). However, near the intermediate voltage of 2.5 V, the turn-on resistance Ron of both transistors is high and the combined turn-on resistance is also high, which is undesirable for a bidirectional analog switch.

Figure 5:
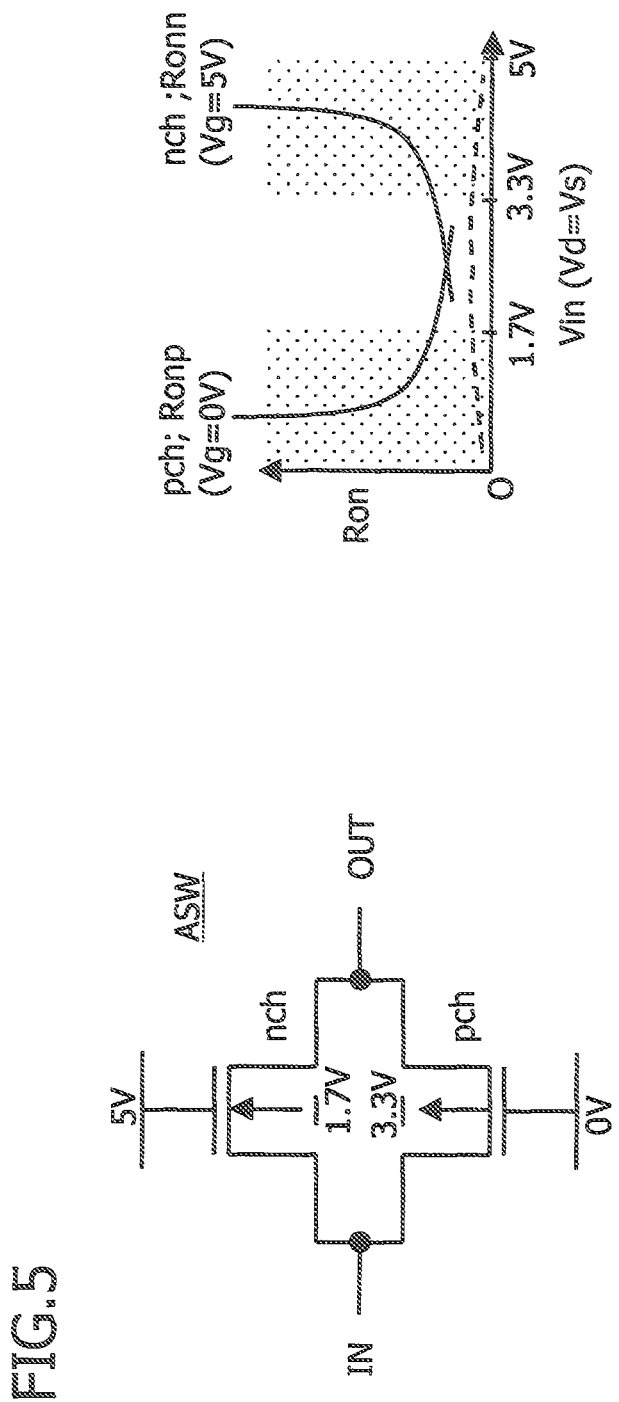
FIG. 5 is a figure representing various examples of gate voltages and back gate voltages of CMOS analog switches.

FIG. 5 is an example in which, conversely with FIG. 4, for the PMOS transistor pch the gate voltage is set to 0 V and the back gate voltage is set to 3.3 V, and for the NMOS transistor nch the gate voltage is set to 5 V and the back gate voltage is set to 1.7 V. In this case, the PMOS transistor pch is conducting for an input voltage Vin of Vth(P) to 5 V, and the NMOS transistor nch is conducting for an input voltage Vin of 0 V to (5 V−Vth(N)). However, similarly to FIG. 3, if the input voltage Vin is from 3.3 V to 5 V, the PN junctions between the P type drain and source regions and the N type back gate region of the PMOS transistor are put into a forward-biased state, and a forward-direction current flows from the drain and source regions to the back gate region. On the other hand, if the input voltage Vin is from 0 V to 1.7 V, the PN junctions between the N type drain and source regions and the P type back gate region of the NMOS transistor are put into a forward-biased state, and a forward-direction leakage current flows from the back gate region to the drain and source regions.

FIG. 6 is an example in which, conversely with FIG. 3, for the PMOS transistor pch the gate voltage is set to 1.7 V and the back gate voltage is set to 5 V, and for the NMOS transistor nch the gate voltage is set to 5 V and the back gate voltage is set to 1.7 V. In this example, the PMOS transistor pch is conducting for an input voltage Vin of (1.7 V+Vth(P)) to 5 V, and the NMOS transistor nch is conducting for an input voltage Vin of 0 V to (5 V−Vth(N)). However, similarly to FIG. 4, if the input voltage Vin is 0 V to 1.7 V, the PN junctions between the N type drain and source regions and the P type back gate region of the NMOS transistor are forward-biased, and a forward-direction leakage current flows from the back gate region to the drain and source regions.

Figure 7:
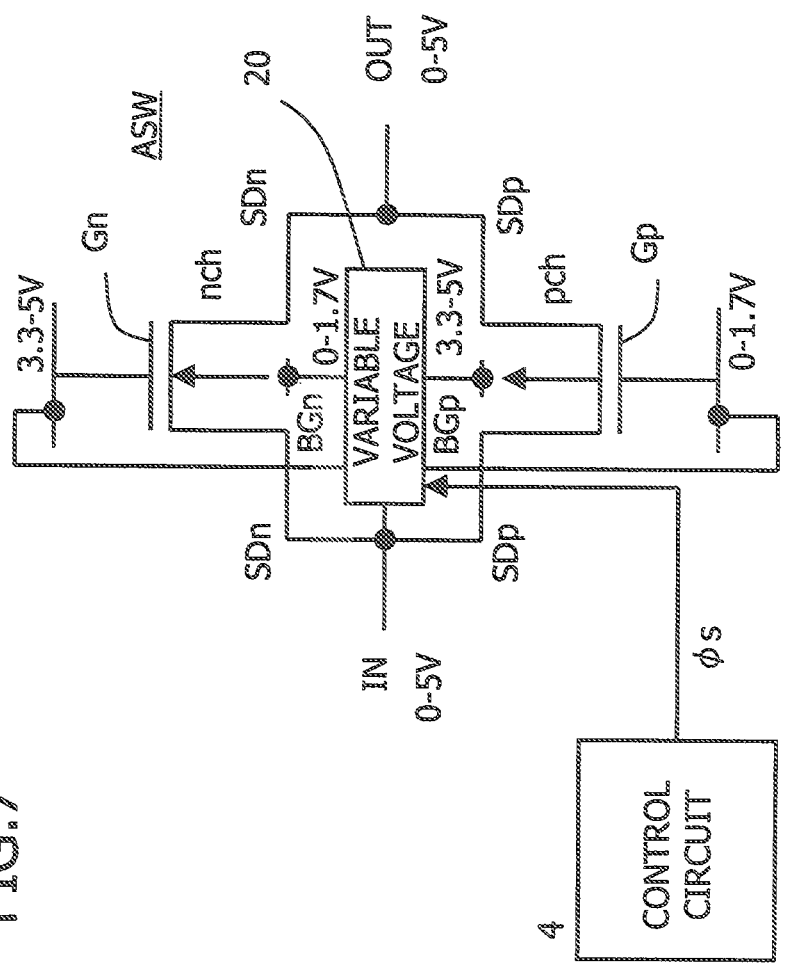
FIG. 7 is a circuit diagram of the CMOS analog switch of this embodiment.

FIG. 7 is a circuit diagram of the CMOS analog switch of this embodiment. This CMOS analog switch device has an analog switch ASW in which a P channel transistor pch and an N channel transistor nch are connected in parallel between an input terminal IN and an output terminal OUT; a variable voltage circuit 20 which variably generates each of the potentials of the voltages of the gate Gp and back gate BGp of the P channel transistor pch and the voltages of the gate Gn and back gate BGn of the N channel transistor nch, according to the input voltage applied to the input terminal; and a control circuit 4 which supplies to the variable voltage circuit 20 a control signal φs which controls the analog switch ASW to be conducting or non-conducting.

In the PMOS transistor, the voltage of the gate Gp is variably controlled between 0 and 1.7 V and the voltage of the back gate BGp is variably controlled between 3.3 and 5 V according to the potential of the input voltage Vin in the range 0 V to 5 V, and moreover the difference between the gate voltage and the back gate voltage is maintained at the gate withstand voltage Vr(Pch). On the other hand, in the NMOS transistor, the voltage of the gate Gn is variably controlled between 3.3 and 5 V and the voltage of the back gate BGn is variably controlled between 0 and 1.7 V according to the potential of the input voltage Vin in the range 0 V to 5 V, and moreover the difference between the gate voltage and the back gate voltage is maintained at the gate withstand voltage Vr(Nch). By this means, even when the input voltage Vin applied to the input terminal IN is a potential between 0 V and 5 V, destroy of gate insulating film does not occur in the CMOS analog switch ASW, and moreover there is no leakage current of the source and drain regions, and a normal conducting state is obtained.

Figure 8:
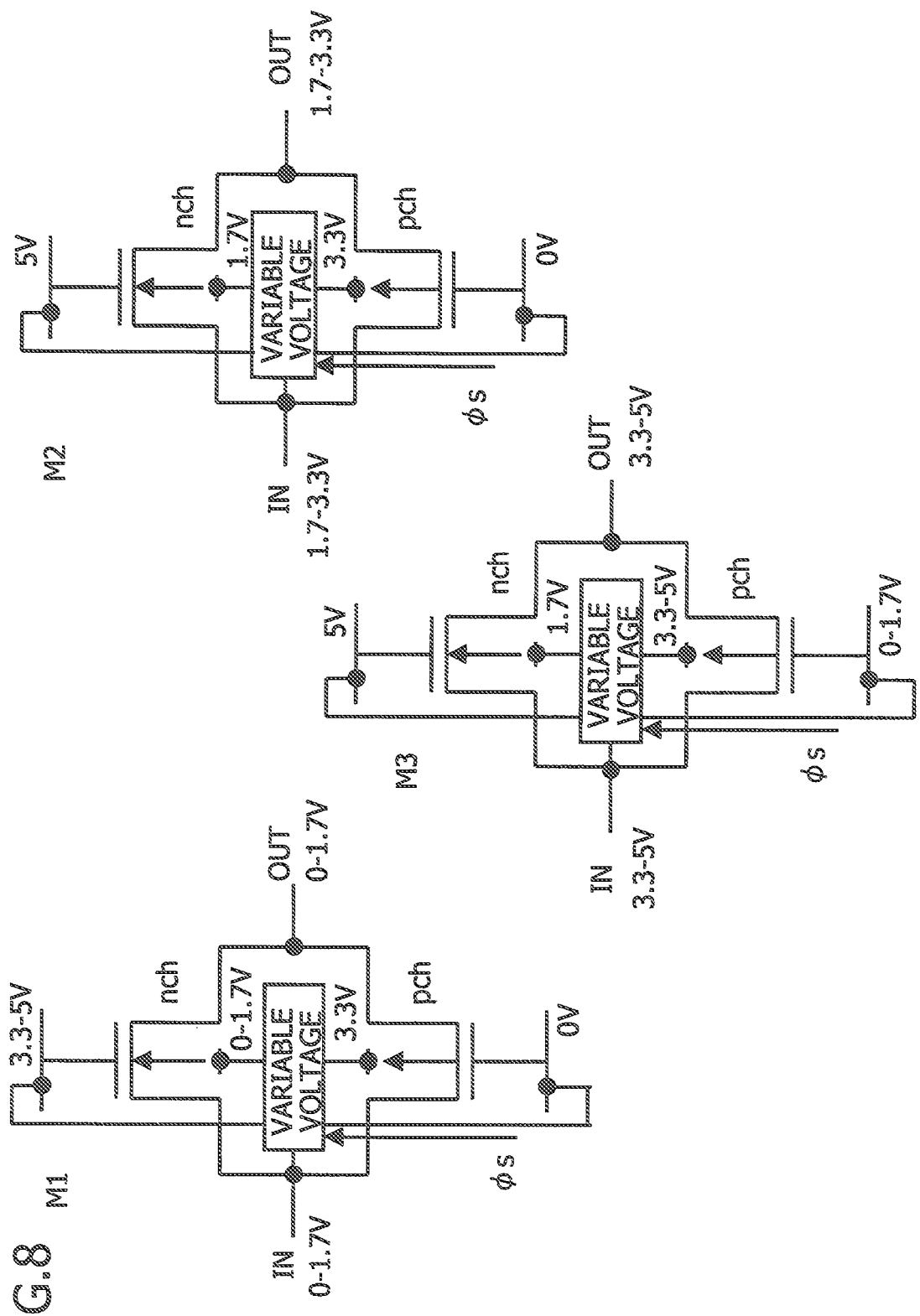
FIG. 8 is a figure representing the gate voltage and back gate voltage corresponding to the input voltage of the CMOS analog switch device of this embodiment.
Figure 9:
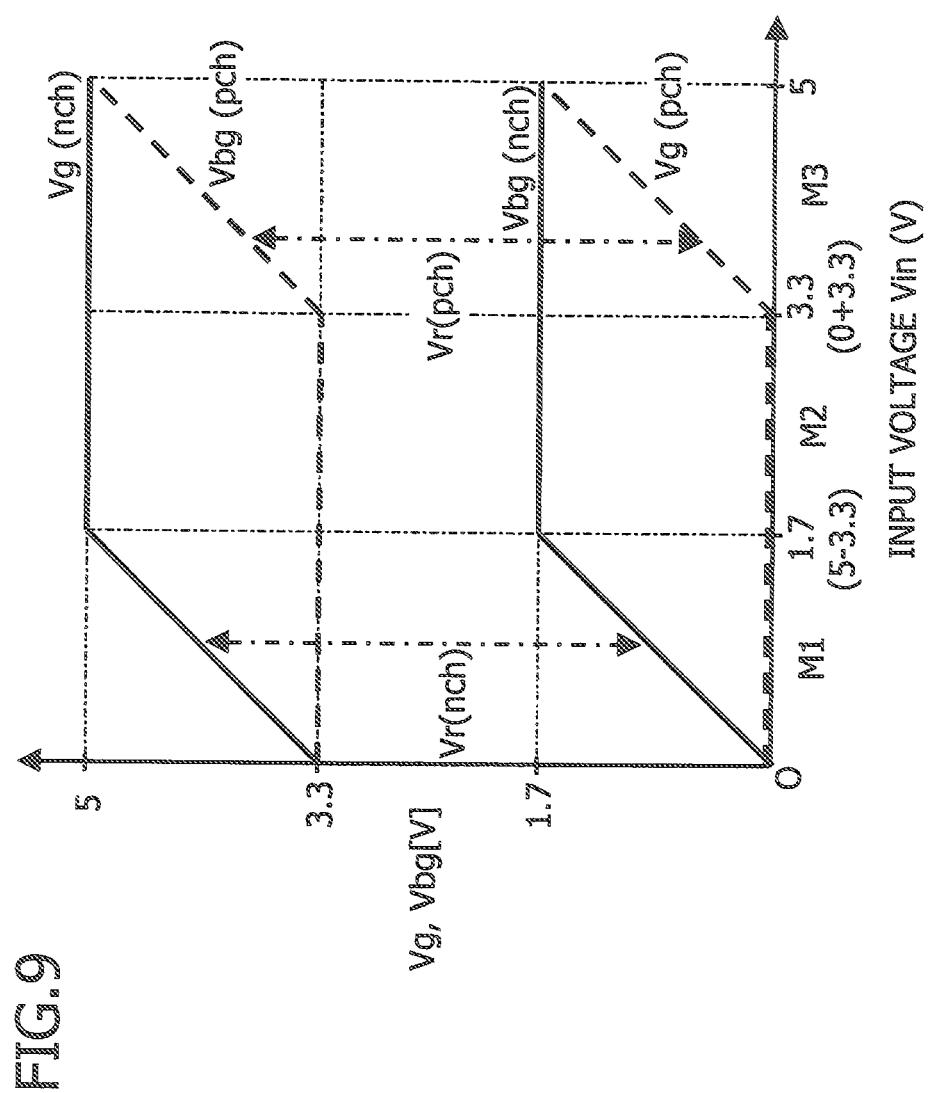
FIG. 9 is a graph representing the gate voltage and back gate voltage corresponding to the input voltage to make the CMOS analog switch device in this embodiment conducting.

FIG. 8 is a figure representing the gate voltage and back gate voltage corresponding to the input voltage of the CMOS analog switch device of this embodiment. FIG. 9 is a graph representing the gate voltage and back gate voltage corresponding to the input voltage to make the CMOS analog switch device in this embodiment conducting.

FIG. 8 is a figure representing the PMOS and NMOS transistor gate voltages and back gate voltages for input voltages Vin in the range M1 from 0 to 1.7 (=5−3.3) V, in the range M2 from 1.7 to 3.3 (=0+3.3) V, and in the range M3 from 3.3 to 5 V. FIG. 9 is a figure representing the gate voltages Vg(pch) and Vg(nch) and the back gate voltages Vbg(pch) and Vbg(nch) of the PMOS and NMOS transistors along the vertical axis, corresponding to the input voltage Vin along the horizontal axis. The dashed lines represent the gate voltage Vg(pch) and back gate voltage Vbg(pch) of the PMOS transistor, and the solid lines represent the gate voltage Vg(nch) and back gate voltage Vbg(nch) of the NMOS transistor. The ranges 0 to 1.7 V, 1.7 to 3.3 V and 3.3 to 5 V of the horizontal axis in FIG. 9 correspond to M1, M2 and M3 in FIG. 8.

In the case of the PMOS transistor, represented by the dashed lines in FIG. 9, when the input voltage Vin is between 0 and 3.3 (=0+Vr(pch)) V (the ranges M1 and M2 in FIG. 8), the back gate voltage Vbg(pch) is set to the gate withstand voltage Vr(pch)=3.3 V of the PMOS transistor, and the gate voltage Vg(pch) is set to 0 V, or lower by the gate withstand voltage Vr(pch)=3.3 V than the back gate voltage Vbg(pch). By this means, the back gate voltage Vbg(pch)=3.3 V is held to be equal to or above the input voltage Vin=0 to 3.3 V, so that a forward-direction leakage current from the drain and source regions to the back gate region does not occur, the voltage difference between the gate and back gate is held to be equal to or below the gate withstand voltage Vr(pch) so that destroy of gate insulating film does not occur, and a conducting state can be maintained.

When the input voltage Vin is from 3.3 to 5 V (range M3 in FIG. 8), the back gate voltage Vbg(pch) is made the same as the input voltage Vin (3.3 to 5 V), and the gate voltage Vg(pch) is made lower by the gate withstand voltage Vr(pch)=3.3 V than the back gate voltage Vbg(pch). That is, variable control is performed such that the back gate voltage and the gate voltage rise according to the input voltage Vin. By this means, because the back gate voltage Vbg(pch) is equal to or greater than the input voltage Vin, a leakage current does not occur, and destroy of gate insulating film also does not occur, and the conducting state is maintained. The threshold voltage Vth(pch) of the PMOS transistor is less than −1 V, and so the gate voltage Vg(pch) of 0 to 1.7 V is equal to or lower than the input voltage Vin of 3.3 to 5 V by the amount of the threshold voltage Vth(pch) or more, and the PMOS transistor can be maintained in the conducting state.

On the other hand, in the case of the NMOS transistor indicated by the solid lines in FIG. 9, when the input voltage Vin is from 5 to 1.7 (=5 V−Vr(nch)) V (ranges M3 and M2 in FIG. 8), the back gate voltage Vbg(nch) is set to the potential lower by the NMOS transistor gate withstand voltage Vr(n-pch)=3.3 V than 5 V, or 1.7 V (=5−3.3 V), and the gate voltage Vg(nch) is set to the potential higher by the gate withstand voltage Vr (nch)=3.3 V than the back gate voltage Vbg(nch), or 5 V. By this means, the back gate voltage Vbg(nch)=1.7 V is kept to be equal to or below the input voltage Vin of 5 to 1.7 V, a forward-direction leakage current from the back gate region in the drain and source regions does not occur, the gate-back gate voltage is kept at or below the gate withstand voltage Vr(nch) so that destroy of gate insulating film also does not occur, and the conducting state is maintained.

When the input voltage Vin is from 1.7 to 0 V (range M1 in FIG. 8), the back gate voltage Vbg(nch) is made the same as the input voltage Vin (1.7 to 0 V), and the gate voltage Vg(nch) is made higher by the gate withstand voltage Vr(nch)=3.3 V than the back gate voltage Vbg(nch). That is, variable control is performed such that the back gate voltage and the gate voltage fall according to the input voltage Vin. By this means, the back gate voltage Vbg(nch) is equal to or lower than the input voltage Vin, so that a leakage current does not occur, destroy of gate insulating film also does not occur, and the conducting state is maintained. The threshold voltage Vth(nch) of the NMOS transistor is less than +1 V, so that the gate voltage Vg(nch) of 5 to 3.3 V is equal to or higher than the input voltage Vin of 1.7 to 0 V by the amount of the threshold voltage Vth(nch) or more, and the NMOS transistor can be maintained in the conducting state.

In FIG. 9, the withstand voltage Vr(pch), Vr(nch) of the PMOS and NMOS transistors are both assumed to be 3.3 V, and so when the input voltage Vin is 5 V, the PMOS gate voltage Vg(pch) and the NMOS back gate voltage Vbg(nch) coincide at 1.7 V, and when the input voltage Vin is 0 V, the gate voltage Vg(nch) and back gate voltage Vbg(pch) coincide at 3.3 V. When the withstand voltages are different for the two transistors, these values may not coincide.

Figure 10:
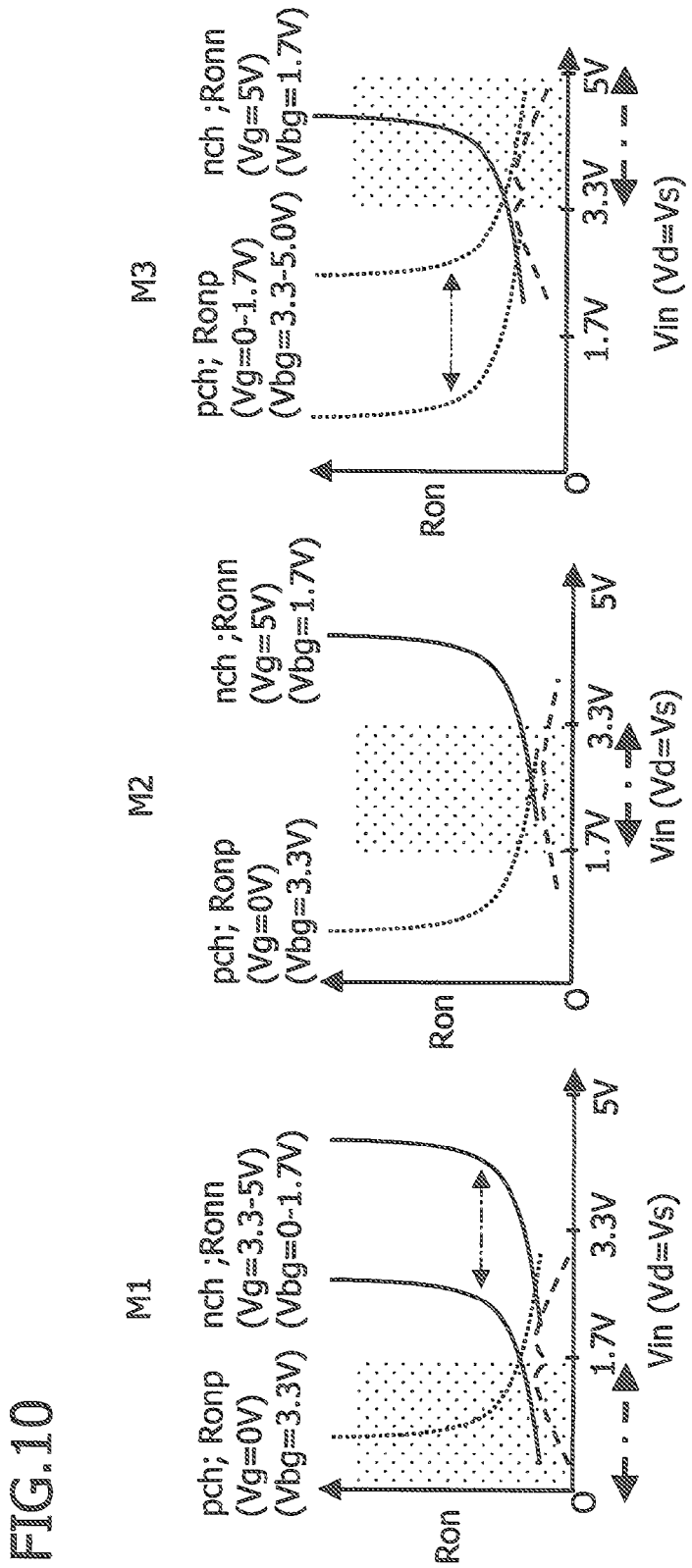
FIG. 10 is a figure representing turn-on resistances of the PMOS and NMOS transistors in the above-described three input voltage ranges M1, M2 and M3.

FIG. 10 is a figure representing turn-on resistances of the PMOS and NMOS transistors in the above-described three input voltage ranges M1, M2 and M3. In the case of the PMOS transistor, for input voltages Vin in the ranges M1 (0 to 1.7 V) and M2 (1.7 to 3.3 V), the gate voltage is fixed at Vg(pch)=0 V and the back gate voltage Vbg(pch) is fixed at 3.3 V, while in the range M3 (3.3 to 5 V), the back gate voltage is variably controlled at Vbg(pch)=Vin=3.3 to 5 V and the gate voltage is variably controlled at Vg(pch)=Vin−Vr(pch)= 0 to 1.7 V, according to the input voltage Vin. Through this variable control, leakage currents in the drain and source regions are prevented.

On the other hand, in the case of the NMOS transistor, for input voltages Vin in the ranges M3 (3.3 to 5 V) and M2 (1.7 to 3.3 V), the gate voltage Vg(nch) is fixed at 5 V and the back gate voltage Vbg(nch) is fixed at 1.7 V, and in the range M1 (0 to 1.7 V), the back gate voltage is variably controlled at Vbg(nch)=Vin=0 to 1.7 V and the gate voltage is variably controlled at Vg(nch)=Vin−Vr(nch)=3.3 to 5 V, according to the input voltage Vin. Through this variable control, leakage currents in the drain and source regions are prevented. Moreover, in all input voltage ranges, the combined turn-on resistance Ron of the PMOS and NMOS transistors is made small.

In the above-described examples, for the maximum voltage Vmax=5 V of the input voltage Vin, the gate withstand voltages Vr(pch), Vr(nch)=3.3 V exceed 50% of the maximum voltage. On the other hand, the input voltage Vin is a voltage between the minimum voltage Vmin=0 V and the maximum voltage Vmax. Below a generalized CMOS analog switch device is explained for an example in which the gate withstand voltages Vr(pch) and Vr(nch) are less than 50% of the maximum voltage Vmax.

Figure 11:
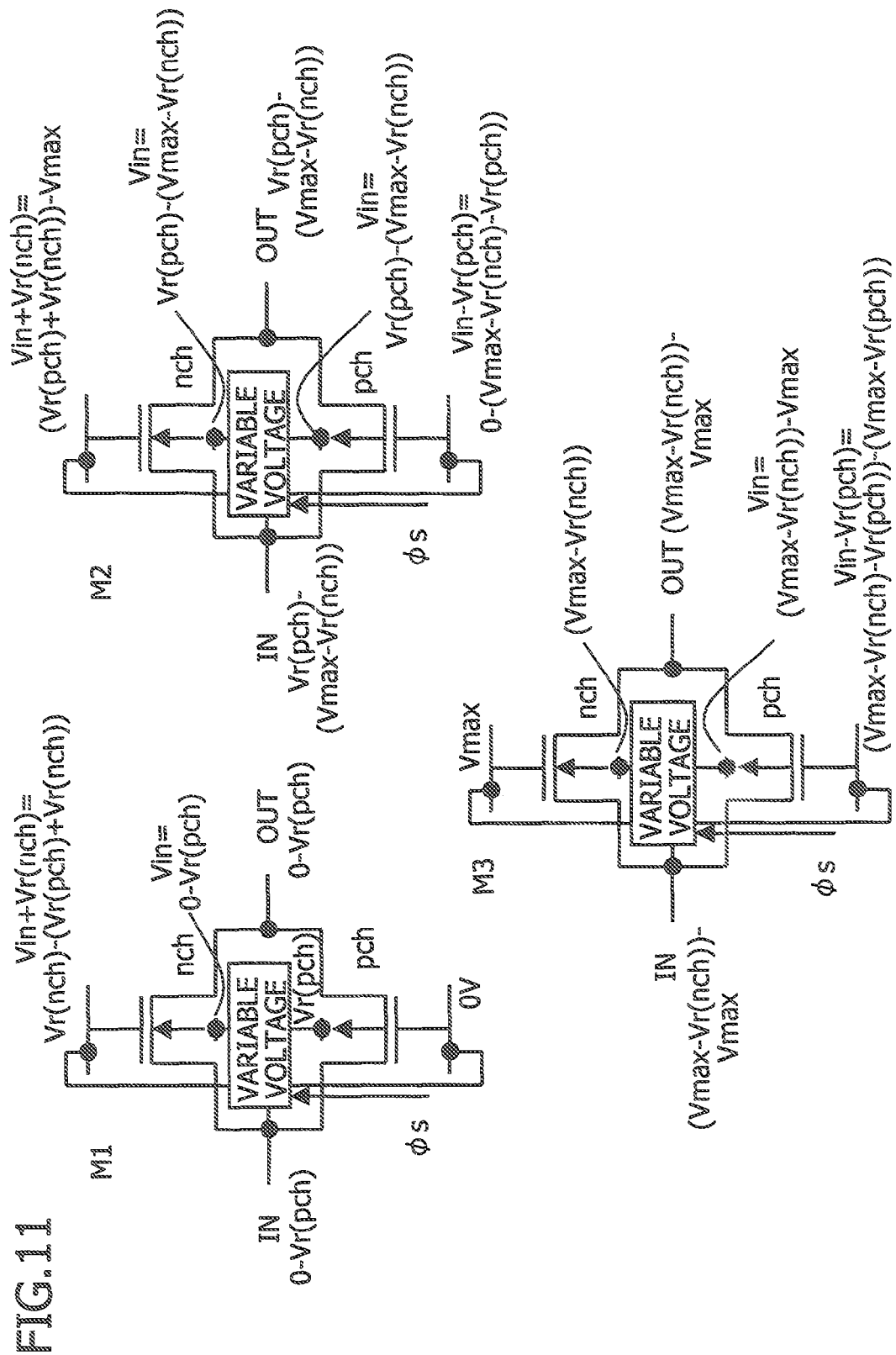
FIG. 11 is a figure representing the gate voltage and back gate voltage in the input voltage ranges M1, M2 and M3 of a generalized CMOS analog switch device of this embodiment.
Figure 12:
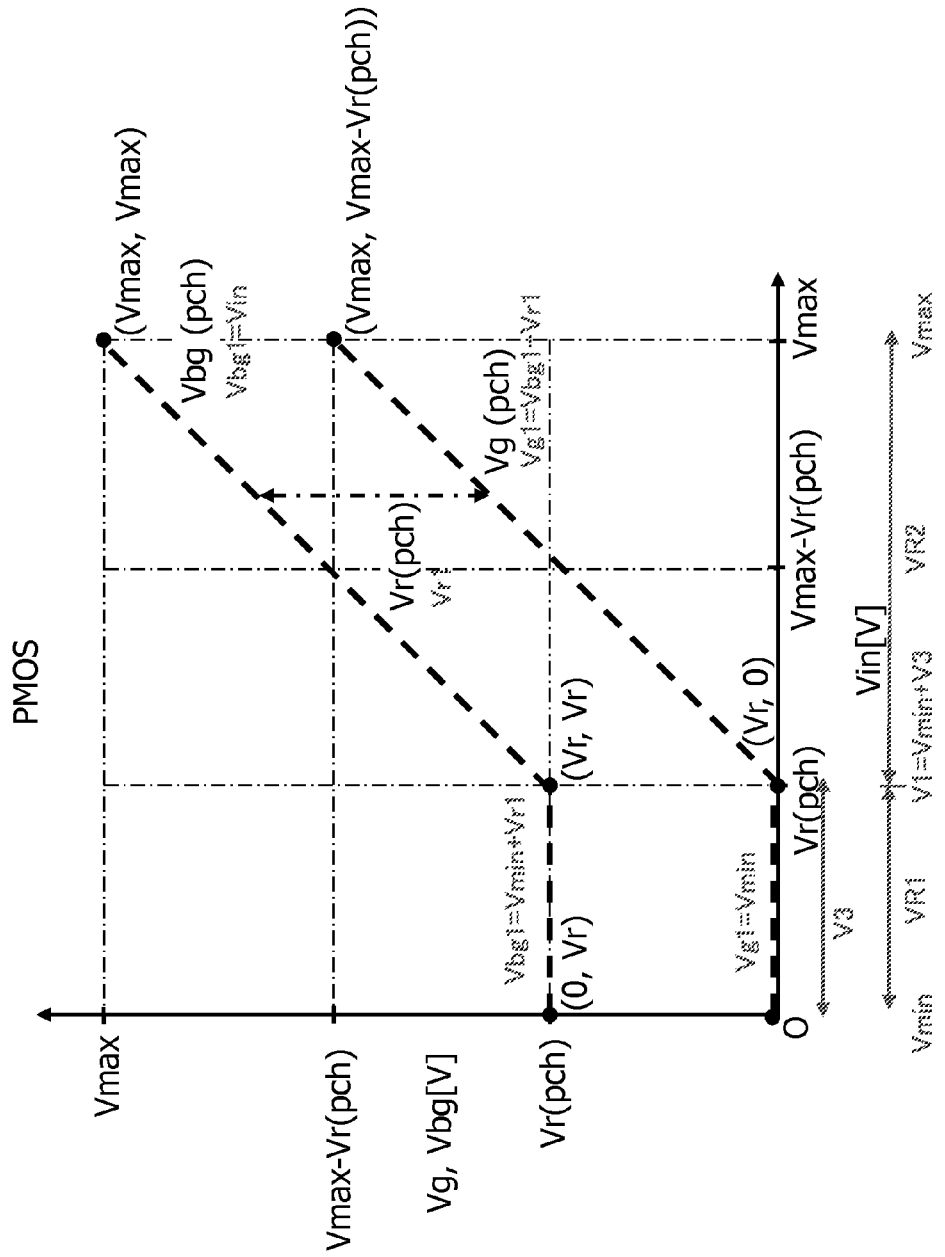
FIG. 12 is a figure representing the gate voltage and back gate voltage versus input voltage Vin of a PMOS transistor.
Figure 13:
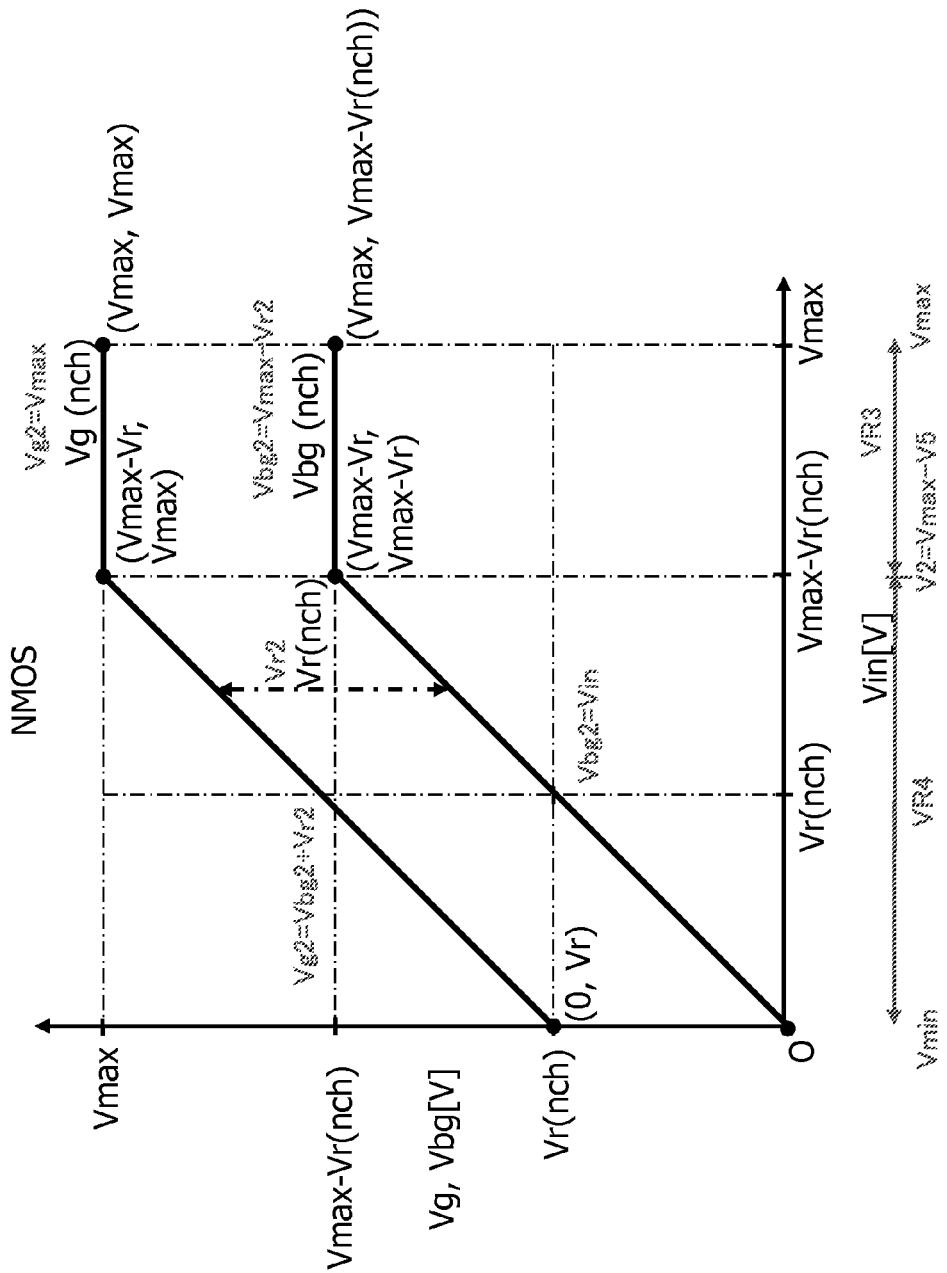
FIG. 13 is a figure representing the gate voltage and back gate voltage versus input voltage Vin of an NMOS transistor.

FIG. 11 is a figure representing the gate voltage and back gate voltage in the input voltage ranges M1, M2 and M3 of a generalized CMOS analog switch device of this embodiment. FIG. 12 is a figure representing the gate voltage and back gate voltage versus input voltage Vin of a PMOS transistor. FIG. 13 is a figure representing the gate voltage and back gate voltage versus input voltage Vin of an NMOS transistor.

First, the PMOS transistor of FIG. 12 is explained. For an input voltage Vin of 0 to Vr(pch), the gate voltage Vg(pch) is fixed at Vmin=0 V and the back gate voltage Vbg(pch) is fixed at Vmin+V(pch)=Vr(pch). By this means, when the input voltage becomes higher than the gate voltage Vg(pch)=0 V by the amount of the threshold voltage Vth(pch), the transistor is conducting, the back gate voltage is equal to or higher than the input voltage Vin so that there is no leakage current, and no destroy of gate insulating film occurs. When the input voltage Vin is between Vr(pch) and Vmax, the back gate voltage is held at Vbg(pch)=Vin and the gate voltage Vg(pch) is made lower than the back gate voltage by the amount of Vr(pch), or Vg(pch)=Vin−Vr(pch), that is, these voltage Vg(pch) and Vbg(pch) are controlled to the voltages which vary according to the input voltage Vin. By this means, the gate voltage Vg(pch) is lower than the input voltage Vin by the amount of the threshold voltage Vth(pch) or more, so that the PMOS transistor is conducting, moreover the back gate voltage is equal to or greater than the input voltage, so that there is no leakage current, and no destroy of gate insulating film occurs.

Next, the NMOS transistor of FIG. 13 is explained. For an input voltage Vin between Vmax and Vmax−Vr(nch), the gate voltage Vg(nch) is fixed at Vmax and the back gate voltage Vbg(nch) is fixed at Vmax−Vr(nch). By this means, the transistor is conducting when the input voltage Vin is lower than the gate voltage Vg(nch)=Vmax by the threshold voltage Vth(nch), moreover the back gate voltage is at or below the input voltage, so that there is no leakage current, and there is no destroy of gate insulating film. Further, for an input voltage Vin between Vmax−Vr(nch) and Vmin, the back gate voltage is kept at Vbg(nch)=Vin and the gate voltage Vg(nch) is kept at a voltage Vg(nch)=Vin+Vr(nch), or higher than the back gate voltage by the amount Vr(nch), that is, the voltages Vbg(nch), Vg(nch) are controlled variably according to the input voltage Vin. By this means, the gate voltage Vg(nch) is higher than the input voltage Vin by an amount equal to or greater than the threshold voltage Vth(nch), so that the NMOS transistor is conducting, moreover the back gate voltage is equal to or lower than the input voltage so that there is no leakage current, and there is no destroy of gate insulating film.

Figure 14:
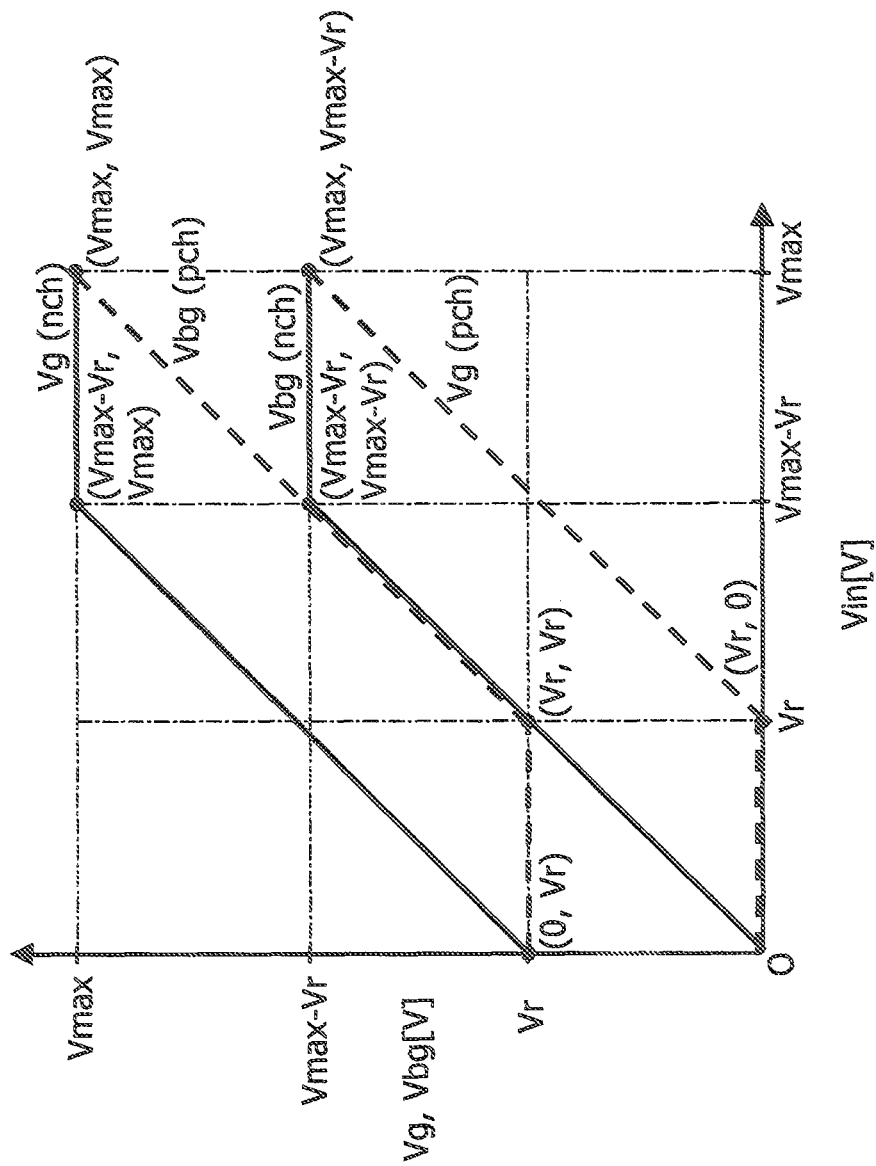
FIG. 14 is a figure representing, in superposition, the gate voltages and back gate voltages of the PMOS transistor and NMOS transistor of FIG. 12 and FIG. 13.

FIG. 14 is a figure representing, in superposition, the gate voltages and back gate voltages of the PMOS transistor and NMOS transistor of FIG. 12 and FIG. 13. In FIG. 14, on the assumption that the gate withstand voltages Vr(pch) and Vr(nch) of the PMOS and NMOS transistors are the same and equal to Vr, the gate voltages and back gate voltages of the PMOS transistor and NMOS transistor of FIG. 12 and FIG. 13 are represented superposed.

Figure 15:
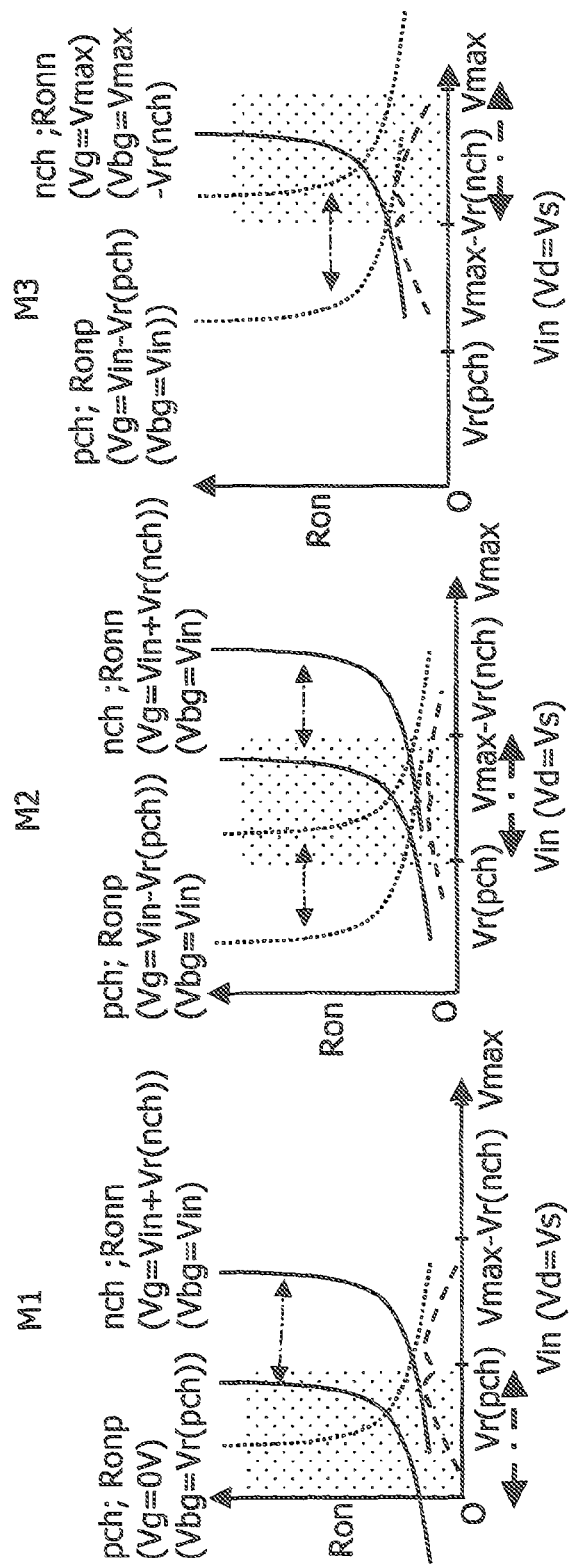
FIG. 15 is a figure representing the PMOS and NMOS transistor turn-on resistances in the three input voltage ranges M1, M2 and M3, for a generalized CMOS analog switch device.

FIG. 15 is a figure representing the PMOS and NMOS transistor turn-on resistances Ron in the three input voltage ranges M1, M2 and M3, for a generalized CMOS analog switch device. In the example of FIG. 15, Vr(pch), Vr(nch) <Vmax/2, so that the three input voltage ranges M1, M2 and M3 are as represented in FIG. 11, and differ from the three input voltage ranges M1, M2 and M3 of FIG. 10.

When the input voltage is in the range M1 (0 to Vr(pch)), the gate voltage and back gate voltage of the PMOS transistor are fixed, but the back gate voltage of the NMOS transistor is equal to the input voltage Vin, and the gate voltage is higher than this by the amount of the gate withstand voltage Vr(nch) (Vin+Vr(nch)), and is controlled at a potential which changes according to the input voltage Vin. By this means leakage currents in the NMOS transistor are avoided.

When the input voltage is in the range M2 (Vr(pch) to (Vmax−Vr(nch))), the back gate voltages of the PMOS and NMOS transistors are equal to the input voltage Vin, and the gate voltages are set to Vin−Vr(pch) and Vin+Vr(nch) respectively. That is, the potentials change according to the input voltage Vin. By this means, leakage currents are avoided in both the PMOS and the NMOS transistors.

When the input voltage is in the range M3 ((Vmax−Vr(nch)) to Vmax), the back gate voltage of the PMOS transistor is equal to the input voltage Vin, and the gate voltage is controlled at Vin−Vr(pch). By this means, leakage currents in the PMOS transistor are avoided. For the NMOS transistor, the gate voltage is fixed at Vmax and the back gate voltage is fixed at Vmax−Vr(nch).

Figure 16:
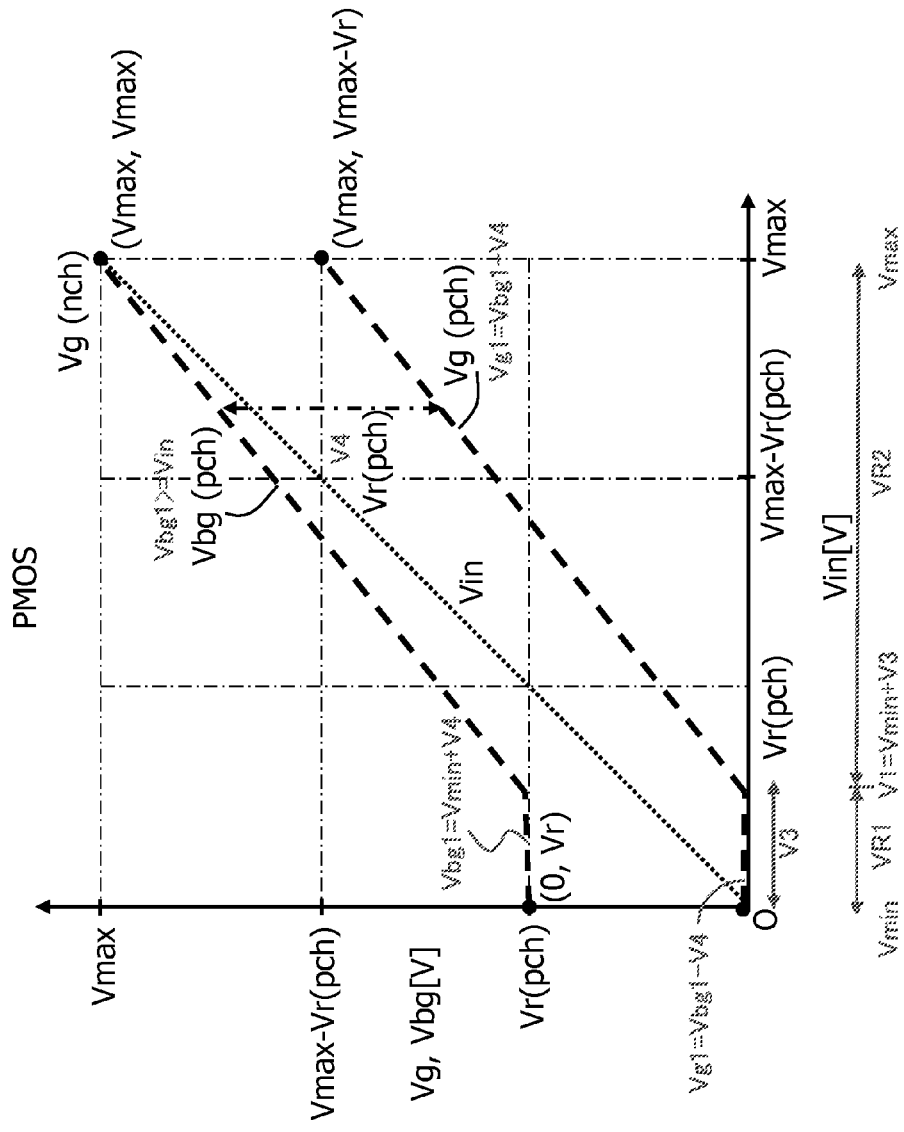
FIG. 16 is a figure representing modified examples of the gate voltages and back gate voltages of the PMOS and NMOS transistors in a generalized CMOS analog switch device.
Figure 17:
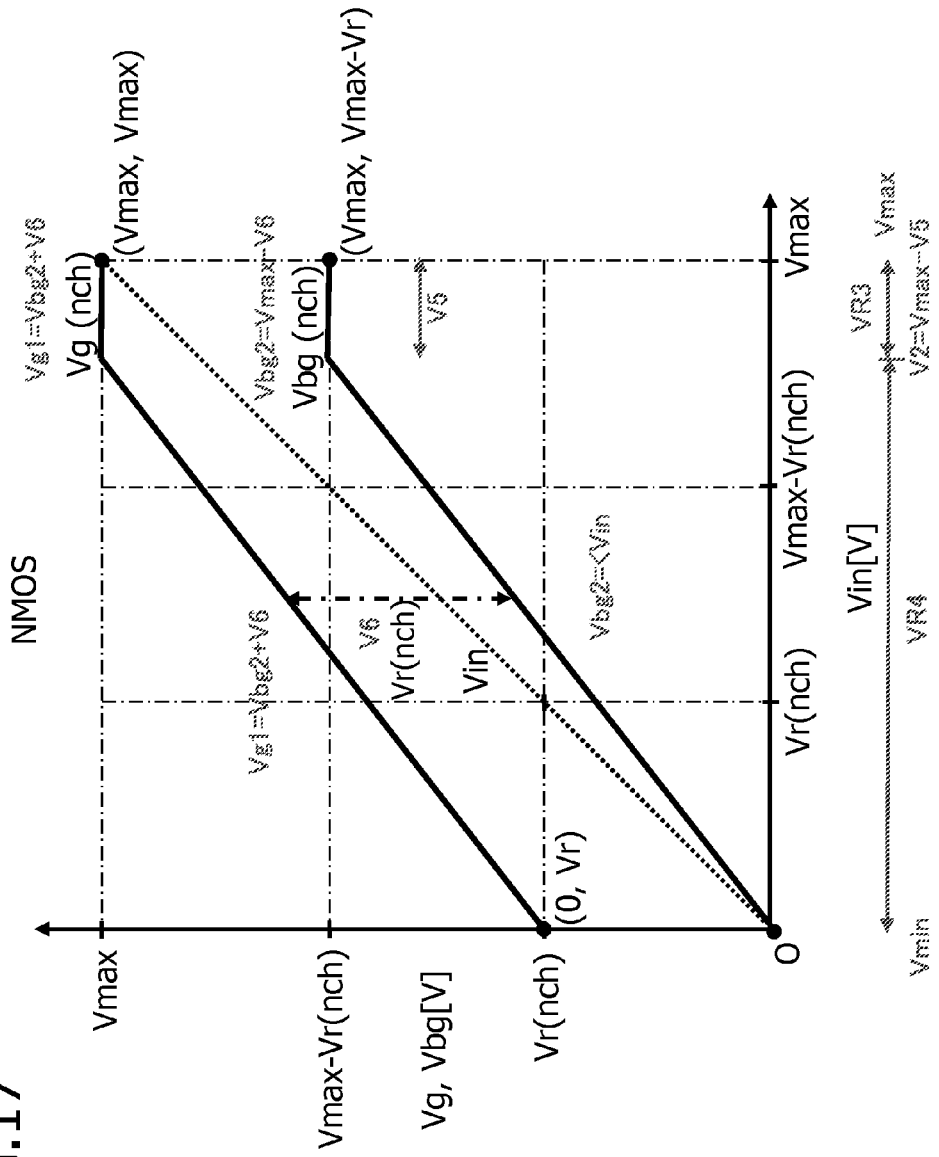
FIG. 17 is a figure representing modified examples of the gate voltages and back gate voltages of the PMOS and NMOS transistors in a generalized CMOS analog switch device.

FIG. 16 and FIG. 17 represent modified examples of the gate voltages and back gate voltages of the PMOS and NMOS transistors in a generalized CMOS analog switch device. These are explained and compared with FIG. 12 and FIG. 13 below.

In the example of the PMOS transistor of FIG. 16, when the input voltage Vin is in the vicinity of 0 V, the gate voltage Vg(pch) is set to 0 V and the back gate voltage Vbg(pch) is set to Vr(pch). However, for input voltages Vin higher than the vicinity of 0 V and up to the maximum input voltage Vmax, the back gate voltage Vbg(pch) is made higher than the input voltage Vin, so that the PN junctions between the drain and source regions and the back gate region are not forward-biased, and the voltage difference between the gate voltage Vg(pch) and the back gate voltage Vbg(pch) is made equal to or lower than the gate withstand voltage Vr(pch). That is, the back gate voltage and the gate voltage are both variably controlled according to the input voltage Vin.

In the example of the NMOS transistor of FIG. 17, conversely with FIG. 16, when the input voltage Vin is in the proximity of the maximum voltage Vmax, the gate voltage Vg(nch) is set to Vmax and the back gate voltage Vbg(nch) is set to Vmax−Vr(nch). However, for input voltages Vin lower than the vicinity of Vmax and down to the minimum input voltage Vmin=0 V, the back gate voltage Vbg(nch) is made lower than the input voltage Vin, so that the PN junctions between the drain and source regions and the back gate region are not forward-biased, and moreover the gate voltage Vg(nch) is made higher than the input voltage Vin by the amount of the threshold voltage Vth(nch), so that the voltage difference between the gate voltage Vg(nch) and the back gate voltage Vbg(nch) is made equal to or lower than the gate withstand voltage Vr(nch). In this case also, similarly to the PMOS transistor, the back gate voltage and the gate voltage are both variably controlled according to the input voltage Vin.

Figure 18:
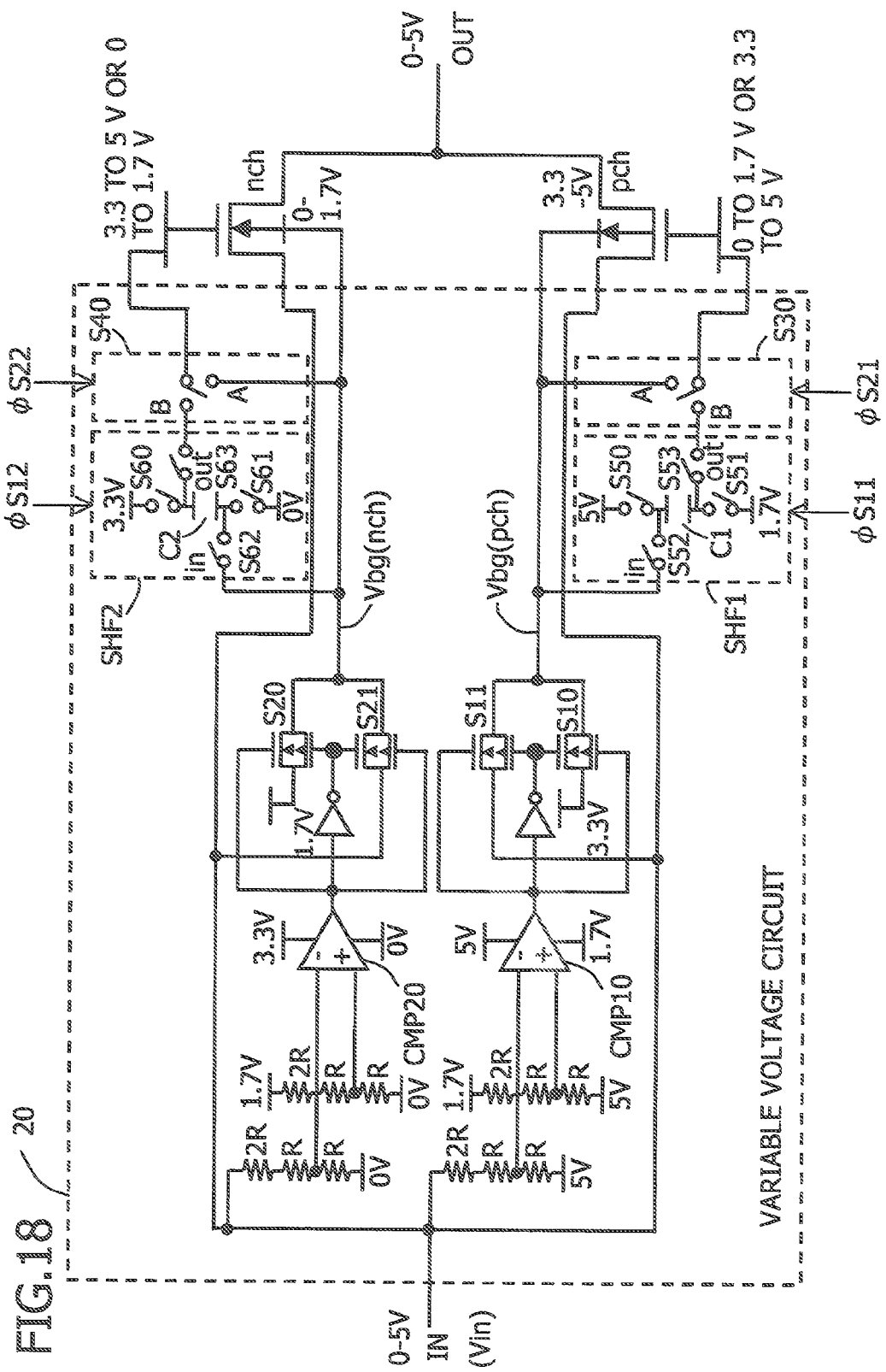
FIG. 18 is a circuit diagram of a variable voltage circuit.

FIG. 18 is a circuit diagram of a variable voltage circuit. This variable voltage circuit 20 is for the example represented in FIG. 8 and FIG. 9, in which the input voltage Vin is from 0 to 5 V and the gate withstand voltages of the PMOS and NMOS transistors are both Vr=3.3 V. The variable voltage circuit 20 is provided within a semiconductor chip as represented in FIG. 1, and the power supply voltage thereof is for example 3.3 V. The variable voltage circuit 20 of FIG. 18 has two comparators CMP10 and CMP20 which form an input voltage detection circuit to detect the voltage range of the input voltage Vin; a pair of first switches S10 and S11 which are turned on and off according to the output from the comparator CMP10; and a pair of second switches S20 and S21 which are turned on and off according to the output from the comparator CMP20.

The comparator CMP10 inputs to the inverting input terminal the voltage obtained by dividing the input voltage Vin using resistances 2R, R and R, inputs to the non-inverting input terminal the voltage obtained by dividing the voltage between 5 V (=Vmax) and 1.7 V (=Vmax−Vr(pch)) by similar resistances, compares the two, and if Vin<3.3 V outputs L level, but if Vin>3.3 V outputs H level. That is, if Vin<3.3 V the switch S10 is conducting and S11 is non-conducting, and 3.3 V is applied as the back gate voltage Vbg(pch) of the PMOS transistor pch, whereas if Vin>3.3 V the switch S10 is non-conducting and S11 is conducting, and the input voltage Vin is applied as the back gate voltage Vbg(pch) of the PMOS transistor pch.

The comparator CMP20 inputs to the inverting input terminal the voltage obtained by dropping the input voltage Vin using resistances 2R, R and R, inputs to the non-inverting input terminal the voltage obtained by dropping the voltage 1.7 V (=Vmax−Vr(nch)) by similar resistances, compares the two, and if Vin>1.7 V outputs H level, but if Vin<1.7 V outputs L level. That is, if Vin>1.7 V the switch S20 is conducting and S21 is non-conducting, and 1.7 V is applied as the back gate voltage Vbg(nch) of the NMOS transistor nch, whereas if Vin<1.7 V the switch S20 is non-conducting and S21 is conducting, and the input voltage Vin is applied as the back gate voltage Vbg(nch) of the NMOS transistor nch.

The variable voltage circuit 20 has a voltage shift circuit SHF1 for the PMOS transistor and a third switch S30 which makes the PMOS transistor pch conducting or non-conducting, as well as a voltage shift circuit SHF2 for the NMOS transistor and a fourth switch S40 which makes the NMOS transistor nch conducting or non-conducting.

The voltage shift circuit SHF1 has a capacitor C1, charging switches S50 and S51, and voltage shift switches S52 and S53; when the charging switches S50 and S51 are turned on by a control signal φS11, the capacitor C1 is charged to 3.3 V, and when the charging switches S50 and S51 are turned off, and the voltage shift switches S52 and S53 are turned on by the control signal φS11, a voltage lower by 3.3 V than the input in is generated at the output out.

When the third switch S30 connects to the terminal B side in response to a control signal φS21, the gate voltage of the PMOS transistor becomes 3.3 V lower than the back gate voltage and the PMOS transistor is conducting, and when the third switch S30 connects to the terminal A side, the gate voltage becomes the same as the back gate voltage and the transistor is non-conducting.

The voltage shift circuit SHF2 has a capacitor C2, charging switches S60 and S61, and voltage shift switches S62 and S63; when the charging switches S60 and S61 are turned on by a control signal φS12, the capacitor C2 is charted to 3.3 V, and when the charging switches S60 and S61 are turned off, and the voltage shift switches S62 and S63 are turned on by the control signal φS12, a voltage higher by 3.3 V than the input in is generated at the output out.

When the fourth switch S40 connects to the terminal B side in response to a control signal φS22, the gate voltage of the NMOS transistor becomes 3.3 V higher than the back gate voltage and the NMOS transistor nch is conducting, and when the fourth switch S40 connects to the terminal A side, the gate voltage becomes the same as the back gate voltage and the transistor is non-conducting.

Figure 19:
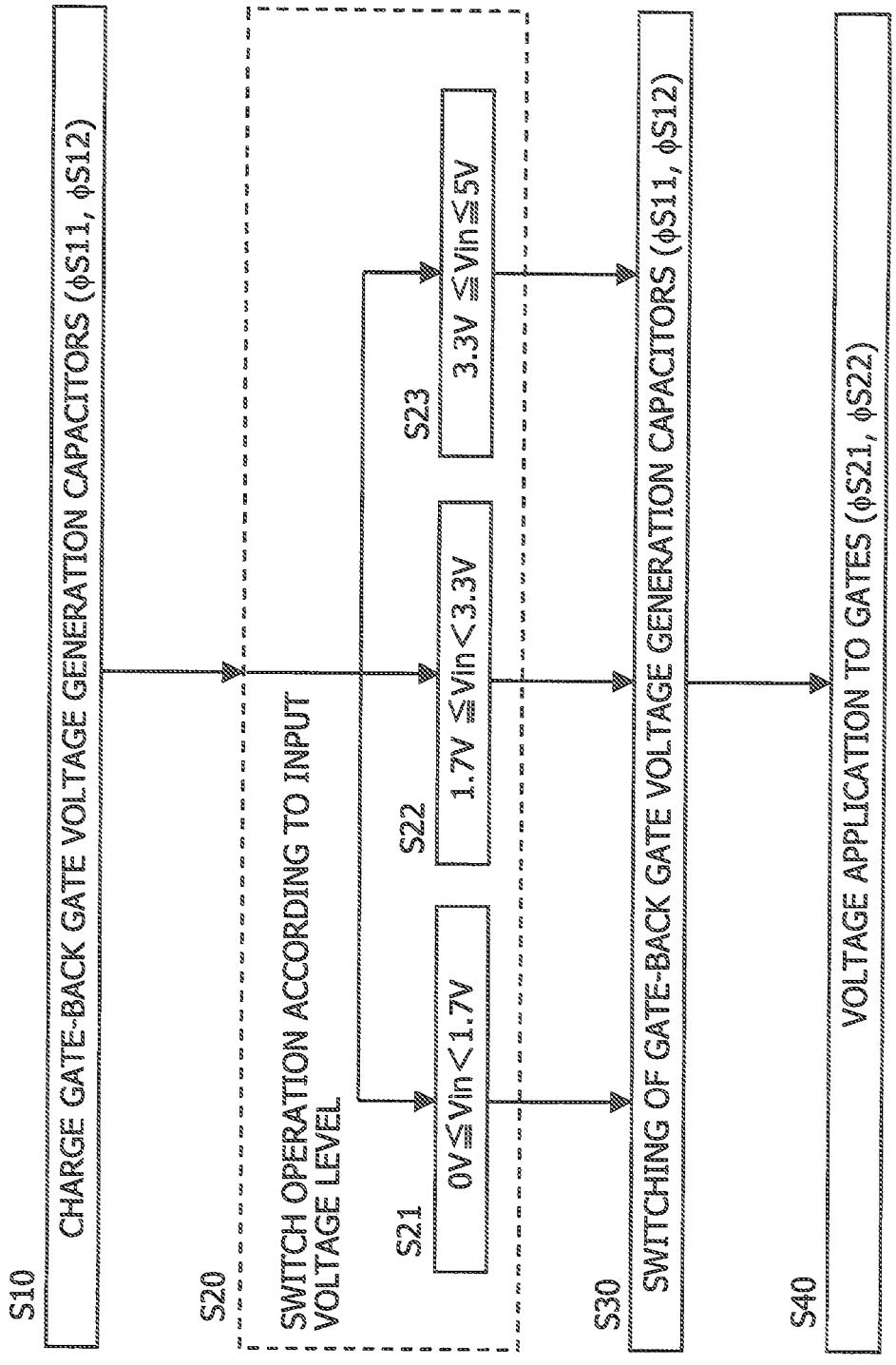
FIG. 19 is a flowchart representing operation of the variable voltage circuit of FIG. 18.

FIG. 19 is a flowchart representing operation of the variable voltage circuit of FIG. 18. As represented in FIG. 18, the variable voltage circuit 20 is controlled by control signals φS11 to φS22 from the control circuit 4. First, charging of the capacitors C1 and C2 which generate voltages between the gates and back gates is performed by the control signals φS11 and φS12 (S10). Specifically, in the voltage shift circuit SFH1 the charging switches S50 and S51 are turned on and the capacitor C1 is charged to the gate withstand voltage of 3.3 V, and in the voltage shift circuit SFH2 the charging switches S60 and S61 are turned on and the capacitor C2 is also charged to the gate withstand voltage of 3.3 V.

The two comparators CMP10 and CMP20, which form an input voltage detection circuit to detect the voltage range of the input voltage Vin, respectively detect whether the input voltage Vin is higher or lower than the gate withstand voltage 3.3 V and whether the input voltage Vin is higher or lower than the voltage 1.7 V (=5−3.3), which is lower by the gate withstand voltage of 3.3 V than the maximum input voltage Vmax=5 V (S20). That is, by means of the combination of the output signals of the two comparators CMP10 and CMP20, whether the input voltage Vin is in the range M1 (0≤Vin<1.7 V), M2 (1.7 V≤Vin<3.3 V), or M3 (3.3 V≤Vin≤Vmax (5 V)), is detected (S21, S22, S23). By means of this detection, the pair of first switches S10 and S11 selects and outputs either 3.3 V or the input Vin as the back gate voltage Vbg(pch) of the PMOS transistor, and the pair of second switches S20 and S21 selects and outputs either 1.7 V or Vin as the back gate voltage Vbg(nch) of the NMOS transistor.

Figure 20:
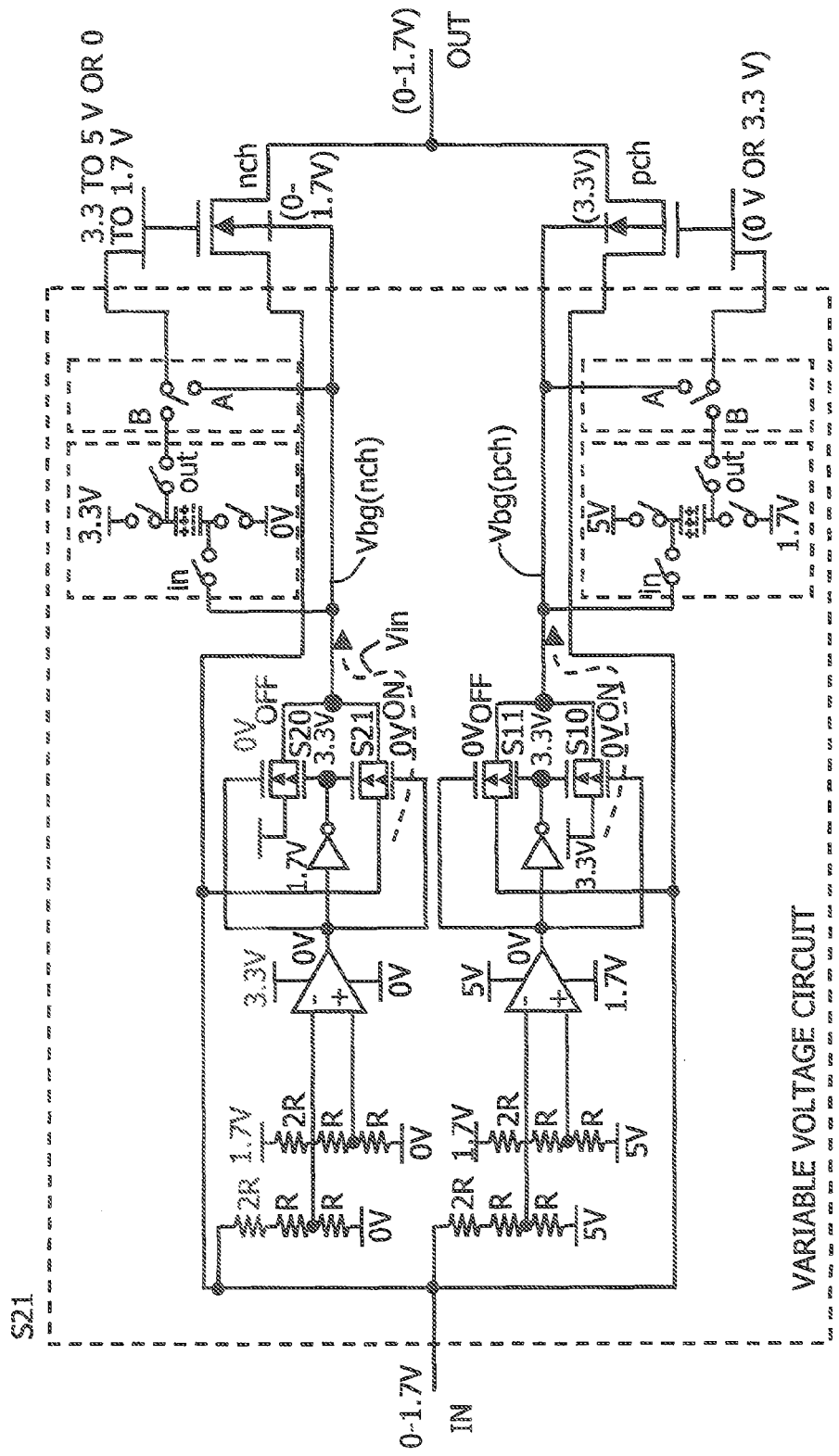
FIG. 20 is a figure representing the state of the variable voltage circuit for the case in which the input voltage Vin is in the range M1.

FIG. 20 is a figure representing the state of the variable voltage circuit for the case in which the input voltage Vin is in the range M1. The input voltage is such that 0≤Vin<1.7 V, so that the switch S10 is on, the switch S11 is off, and the back gate voltage Vbg(pch) is 3.3 V, and the switch S20 is off, the switch S21 is on, and the back gate voltage Vbg(nch) is the input voltage Vin.

Figure 21:
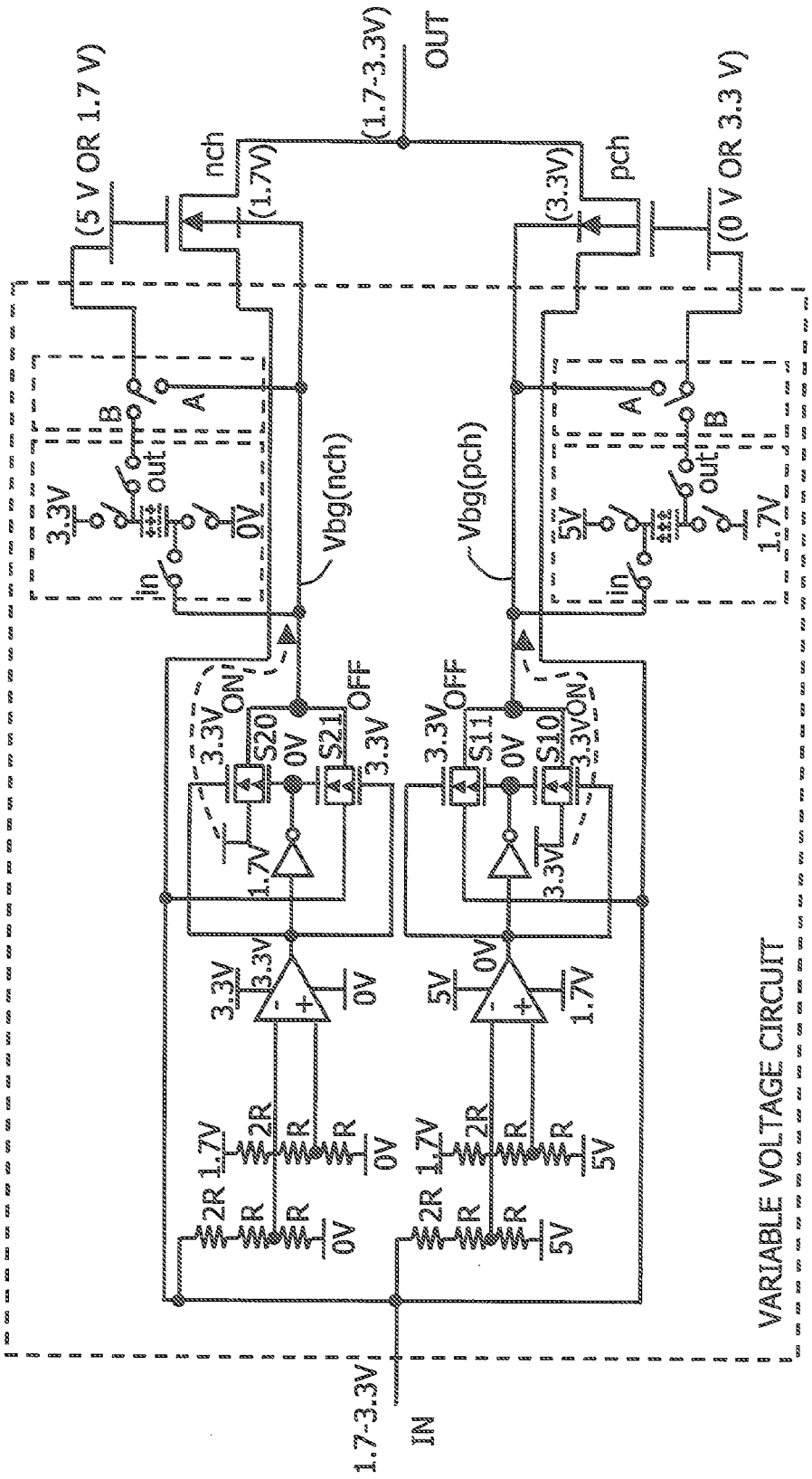
FIG. 21 is a figure representing the state of the variable voltage circuit for the case in which the input voltage Vin is in the range M2.

FIG. 21 is a figure representing the state of the variable voltage circuit for the case in which the input voltage Vin is in the range M2. The input voltage is such that 1.7≤Vin<3.3 V, so that the switch S10 is on, the switch S11 is off, and the back gate voltage Vbg(pch) is 3.3 V, and the switch S20 is on, the switch S21 is off, and the back gate voltage Vbg(nch) is 1.7 V.

Figure 22:
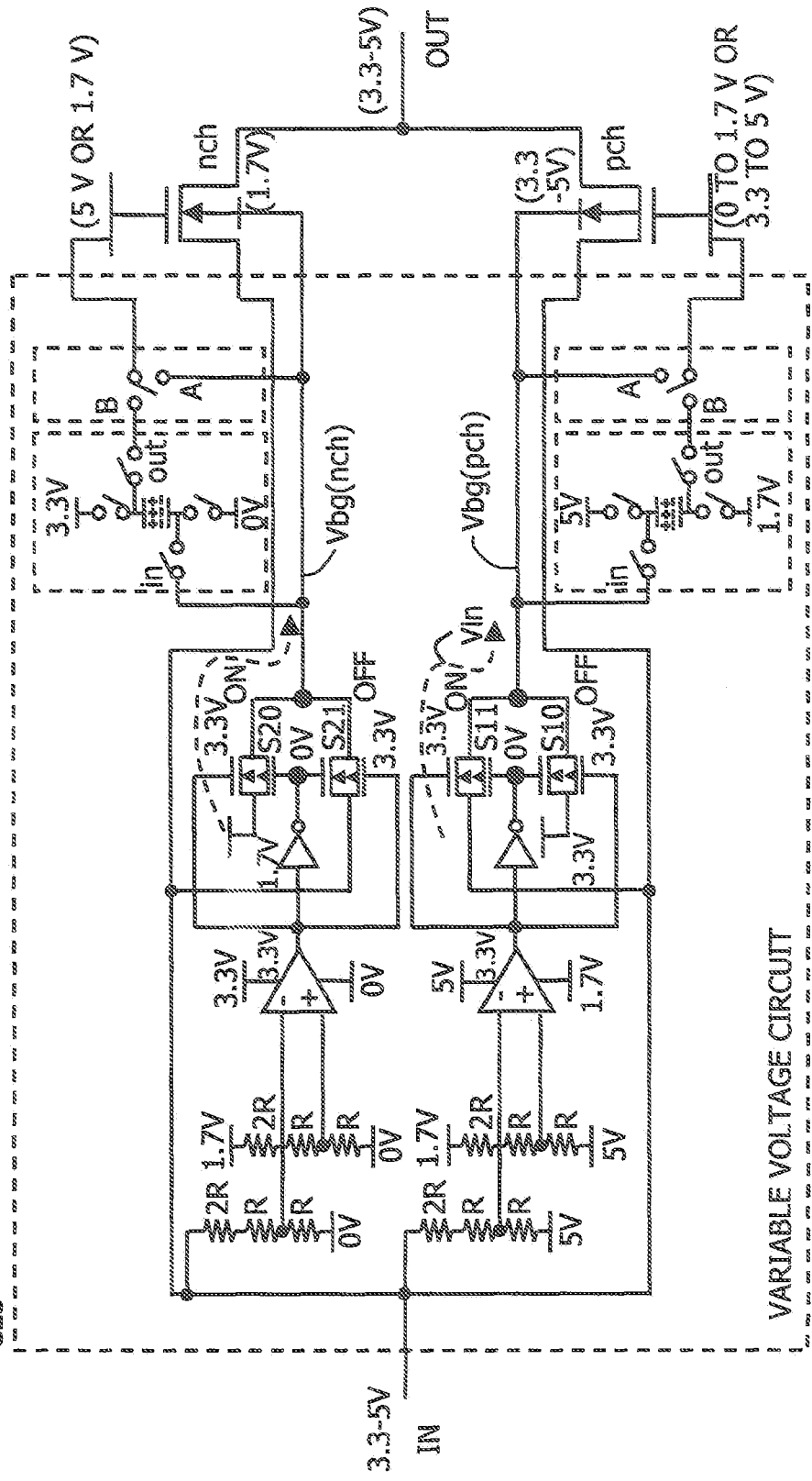
FIG. 22 is a figure representing the state of the variable voltage circuit for the case in which the input voltage Vin is in the range M3.

FIG. 22 is a figure representing the state of the variable voltage circuit for the case in which the input voltage Vin is in the range M3. The input voltage is such that 3.3≤Vin≤Vmax (5 V), so that the switch S10 is off, the switch S11 is on, and the back gate voltage Vbg(pch) is the input voltage Vin, and the switch S20 is on, the switch S21 is off, and the back gate voltage Vbg(nch) is 1.7 V.

And, by means of the control signals φS11 and φS12, the charging switches S50 and S51 within the voltage shift circuit SHF1 are turned off and the voltage shift switches S52 and S53 within the voltage shift circuit SHF1 are turned on, while the charging switches S60 and S61 within the voltage shift circuit SHF2 are turned off and the voltage shift switches S62 and S63 within the voltage shift circuit SFH2 are turned on (S30). By this means, the output out of the voltage shift circuit SHF1 goes to the potential lower by the amount of the gate withstand voltage, 3.3 V, than the back gate voltage Vbg(pch), and the output out of the voltage shift circuit SHF2 goes to the potential higher by the amount of the gate withstand voltage, 3.3 V, than the back gate voltage Vbg(nch).

Finally, the third switch S30 connects the terminal A or terminal B, and the fourth switch S40 connects the terminal A or terminal B, according to the control signals φS21 and φS22 from the control circuit which make the analog switch conducting or non-conducting. If both switches S30 and S40 connect the terminal B side, the gate voltage of the PMOS transistor pch goes to Vbg(pch)−3.3 V and the gate voltage of the NMOS transistor nch goes to Vbg(nch)+3.3 V, and both transistors are in the conducting state. On the other hand, if both switches S30 and S40 connect the terminal A side, the gate voltages of the PMOS and NMOS transistors are the same as the respective back gate voltages Vbg(pch) and Vbg(nch), and both transistors are in the non-conducting state.

The above-described processes S10 and S30 need not be performed in each switching cycle of the CMOS analog switch. In one switching cycle, at least the processes S20 and S40 are performed.

As described above, the CMOS analog switch device of this embodiment performs the appropriate conducting state for an input signal in a voltage range equal to or greater than the gate withstand voltage. Hence a CMOS analog switch provided in an LSI chip with a low power supply voltage and low gate withstand voltage performs appropriately switching even for input voltages exceeding the power supply voltage.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A semiconductor device, comprising:
an analog switch including a P channel transistor and an N channel transistor connected in parallel between an input terminal and an output terminal; and
a variable voltage circuit configured to variably generates, according to an input voltage applied to the input terminal, potentials of a first gate voltage and first back gate voltage of the P channel transistor and of a second gate voltage and second back gate voltage of the N channel transistor,
wherein the P channel transistor has a first gate withstanding voltage, and the N channel transistor has a second gate withstanding voltage
wherein the input voltage has a potential in a range from a minimum voltage to a maximum voltage,
wherein, for the P channel transistor, the variable voltage circuit sets the first back gate voltage to a voltage higher by a fourth voltage than the minimum voltage when the input voltage is in a first voltage range of voltages equal to or higher than the minimum voltage and equal to or lower than a first voltage which is higher by a third voltage than the minimum voltage, the variable voltage circuit sets the first back gate voltage to a voltage equal to or higher than the input voltage when the input voltage is in a second voltage range of voltages equal to or higher than the first voltage and equal to or lower than the maximum voltage, and the variable voltage circuit sets the first gate voltage to a voltage lower by the fourth voltage than the first back gate voltage when the input voltage is in the first or second voltage range,
wherein, for the N channel transistor, the variable voltage circuit sets the second back gate voltage to a voltage lower by a sixth voltage than the maximum voltage when the input voltage is in a third voltage range of voltages equal to or lower than the maximum voltage and equal to or higher than a second voltage which is lower by a fifth voltage than the maximum voltage, the variable voltage circuit sets the second back gate voltage to the input voltage or lower when the input voltage is in a fourth voltage range of voltages equal to or lower than the second voltage and equal to or higher than the minimum voltage, and the variable voltage circuit sets the second gate voltage to a voltage higher by the sixth voltage than the second back gate voltage when the input voltage is in the third or fourth voltage range, and
wherein the third and fourth voltages are equal to or lower than the first gate withstanding voltage, and the fifth and sixth voltages are equal to or lower than the second gate withstanding voltage.

2. The semiconductor device according to claim 1, wherein
for the P channel transistor, when the input voltage is in the first voltage range, the variable voltage circuit sets the first gate voltage to the minimum voltage and sets the first back gate voltage to a voltage higher by the first gate withstand voltage than the minimum voltage, and when the input voltage is in the second voltage range, the variable voltage circuit sets the first back gate voltage to the same voltage as the input voltage and sets the first gate voltage to a voltage lower by the first gate withstand voltage than the first back gate voltage; and
for the N channel transistor, when the input voltage is in the third voltage range, the variable voltage circuit sets the second gate voltage to the maximum voltage and sets the second back gate voltage to a voltage lower by the second gate withstand voltage than the maximum voltage, and when the input voltage is in the fourth voltage range, the variable voltage circuit sets the second back gate voltage to the same voltage as the input voltage and sets the second gate voltage to a voltage higher by the second gate withstand voltage than the second back gate voltage.

3. The semiconductor device according to claim 2, wherein the variable voltage circuit comprises:
an input voltage detection circuit, which detects the range, from among the first to fourth voltage ranges, of the input voltage;
a first switch which, according to detection, by the input voltage detection circuit, of the first or second voltage range, connects an output terminal to the first back gate voltage to a voltage higher by the first gate withstand voltage than the minimum voltage, or to the input terminal;
a first voltage shift circuit which supplies, to an output terminal to the first gate voltage, a voltage lower by the first gate withstand voltage than the output terminal to the first back gate voltage;
a second switch which, according to detection, by the input voltage detection circuit, of the third or fourth voltage range, connects an output terminal to the second back gate voltage to a voltage lower by the second gate withstand voltage than the maximum voltage, or to the input terminal; and
a second voltage shift circuit, which supplies, to an output terminal to the second gate voltage, a voltage higher by the second gate withstand voltage than the output terminal to the second back gate voltage.

4. The semiconductor device according to claim 3, wherein the variable voltage circuit comprises:
a third switch, which, in response to a control signal controlling the analog switch to be conducting or non-conducting, respectively connects to the output terminal to the first gate voltage a voltage lower by the first gate withstand voltage than the output terminal to the first back gate voltage or the first back gate voltage; and
a fourth switch, which, in response to the control signal controlling the analog switch to be conducting or non-conducting, respectively connects to the output terminal to the second gate voltage a voltage higher by the second gate voltage than the output terminal to the second back gate voltage or the second back gate voltage.

5. The semiconductor device according to claim 1, comprising:
an external input terminal connected to an external terminal of a device to be tested; and
a voltage measurement portion which is connected to the external input terminal via the semiconductor device, and which measures the voltage at the external terminal of the device to be tested when the analog switch is conducting.

6. A method of controlling an analog switch in which a P channel transistor and an N channel transistor are connected in parallel between an input terminal and an output terminal, with the P channel transistor having a first gate withstand voltage, and the N channel transistor having a second gate withstand voltage, and the input voltage having a potential in a range from a minimum voltage to a maximum voltage, the control method comprising:
controlling the P channel transistor, such that a first back gate voltage of the P channel transistor is higher by a fourth voltage than the minimum voltage when the input voltage is in a first voltage range of voltages equal to or higher than the minimum voltage and equal to or lower than a first voltage which is higher by a third voltage than the minimum voltage, the first back gate voltage is equal to or higher than the input voltage when the input voltage is in a second voltage range of voltages equal to or higher than the first voltage and equal to or lower than the maximum voltage, and a first gate voltage of the P channel transistor is lower by the fourth voltage than the first back gate voltage when the input voltage is in the first or second voltage range; and controlling the N channel transistor, such that a second back gate voltage of the N channel transistor is lower by a sixth voltage than the maximum voltage when the input voltage is in a third voltage range of voltages equal to or lower than the maximum voltage and equal to or higher than a second voltage which is lower by a fifth voltage than the maximum voltage, the second back gate voltage is the input voltage or lower when the input voltage is in a fourth voltage range of voltages equal to or lower than the second voltage and equal to or higher than the minimum voltage, and a second gate voltage of the N channel transistor is higher by the sixth voltage than the second back gate voltage when the input voltage is in the third or fourth voltage range, and wherein the third and fourth voltages are equal to or lower than the first gate withstanding voltage, and the fifth and sixth voltages are equal to or lower than the second gate withstanding voltage.

7. A method of controlling an analog switch in which a P channel transistor and an N channel transistor are connected in parallel between an input terminal and an output terminal, with the P channel transistor having a first gate withstand voltage which is a maximum tolerated voltage at which a gate insulating film is not destroyed, and the N channel transistor having a second gate withstand voltage which is a maximum tolerated voltage at which a gate insulating film is not destroyed, and the input voltage having a potential in a range from a minimum voltage to a maximum voltage, the control method comprising:

controlling the P channel transistor, such that when the input voltage is in a first voltage range of voltages equal to or higher than the minimum voltage and equal to or lower than a first voltage which is higher by the first gate withstand voltage than the minimum voltage, a first gate voltage of the P channel transistor is equal to the minimum voltage and a first back gate voltage of the P channel transistor is higher by the first gate withstand voltage than the minimum voltage, and such that when the input voltage is in a second voltage range of voltages equal to or higher than the first voltage and equal to or lower than the maximum voltage, the first back gate voltage is equal to the input voltage and the first gate voltage is lower by the first gate withstand voltage than the first back gate voltage; and controlling the N channel transistor, such that when the input voltage is in a third voltage range of voltages equal to or lower than the maximum voltage and equal to or higher than a second voltage which is lower by the second gate withstand voltage than the maximum voltage, a second gate voltage of the N channel transistor is equal to the maximum voltage and a second back gate voltage of the N channel transistor is lower by the second gate withstand voltage than the maximum voltage, such that when the input voltage is in a fourth voltage range of voltages equal to or lower than the second voltage and equal to or higher than the minimum voltage, the second back gate voltage is equal to the input voltage and the second gate voltage is higher by the second gate withstand voltage than the second back gate voltage.

* * * * *